(12) United States Patent
Wei et al.

(10) Patent No.: US 12,211,786 B2
(45) Date of Patent: Jan. 28, 2025

(54) STACKED VIAS WITH BOTTOM PORTIONS FORMED USING SELECTIVE GROWTH

(71) Applicant: Intel Corporation, Santa Clara, CA (US)

(72) Inventors: Andy Chih-Hung Wei, Yamhill, OR (US); Guillaume Bouche, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 742 days.

(21) Appl. No.: 17/197,659

(22) Filed: Mar. 10, 2021

(65) Prior Publication Data

US 2022/0293517 A1 Sep. 15, 2022

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76879* (2013.01); *H01L 21/76897* (2013.01); *H01L 23/528* (2013.01)

(58) Field of Classification Search
CPC ........... H01L 23/5226; H01L 21/76879; H01L 21/76811; H01L 21/76831; H01L 21/76897
See application file for complete search history.

(56) References Cited

U.S. PATENT DOCUMENTS

| 5,364,493 | A | 11/1994 | Hunter, Jr. et al. |
| 5,582,679 | A | 12/1996 | Lianjun et al. |
| 6,352,917 | B1 | 3/2002 | Gupta et al. |
| 6,413,872 | B1 | 7/2002 | Kitch |
| 6,989,603 | B2 * | 1/2006 | Zhang .................. G03F 7/0035 257/773 |

(Continued)

FOREIGN PATENT DOCUMENTS

| WO | 0137339 A1 | 5/2001 | |
| WO | WO-2021079211 A1 * | 4/2021 | ......... H01L 21/0332 |

OTHER PUBLICATIONS

Extended European Search Report from European Application No. 20212636.5 dated Jul. 18, 2022, 9 pages.

(Continued)

*Primary Examiner* — Mamadou L Diallo
(74) *Attorney, Agent, or Firm* — Akona IP PC

(57) ABSTRACT

Disclosed herein are methods for fabricating IC structures that include stacked vias providing electrical connectivity between metal lines of different layers of a metallization stack, as well as resulting IC structures. An example IC structure includes a first and a second metallization layers, including, respectively, a bottom metal line and a top metal line. The IC structure further includes a via that has a bottom via portion and a top via portion, where the top via portion is stacked over the bottom via portion (hence, the via may be referred to as a "stacked via"). The bottom via portion is coupled and self-aligned to the bottom electrically conductive line, while the top via portion is coupled and self-aligned to the top electrically conductive line. The bottom via portion is formed using selective growth, e.g., assisted by a self-assembled monolayer (SAM) material.

20 Claims, 15 Drawing Sheets

(56) References Cited

U.S. PATENT DOCUMENTS

| | | | |
|---|---|---|---|
| 9,876,068 B1 | 1/2018 | Yang | |
| 9,922,929 B1 | 3/2018 | Zhang et al. | |
| 10,424,507 B2* | 9/2019 | Zhang | H01L 23/481 |
| 2002/0155693 A1 | 10/2002 | Hong et al. | |
| 2009/0057907 A1* | 3/2009 | Yang | H01L 23/525 |
| | | | 257/E23.141 |
| 2009/0251944 A1 | 10/2009 | Happ et al. | |
| 2009/0261313 A1 | 10/2009 | Lung et al. | |
| 2012/0013009 A1* | 1/2012 | Zhu | H01L 21/76808 |
| | | | 257/E23.157 |
| 2012/0032323 A1 | 2/2012 | Matsumoto et al. | |
| 2012/0086128 A1* | 4/2012 | Ponoth | H01L 21/76885 |
| | | | 257/E21.583 |
| 2013/0168867 A1 | 7/2013 | Shim | |
| 2014/0225261 A1 | 8/2014 | Lee et al. | |
| 2015/0035162 A1* | 2/2015 | Lan | H01L 28/10 |
| | | | 716/110 |
| 2015/0102496 A1 | 4/2015 | Zhang | |
| 2016/0049332 A1 | 2/2016 | Xie et al. | |
| 2018/0261497 A1 | 9/2018 | Drissi et al. | |
| 2018/0261544 A1 | 9/2018 | Kim et al. | |
| 2019/0067102 A1 | 2/2019 | Zhang et al. | |
| 2019/0067194 A1 | 2/2019 | Yu et al. | |
| 2019/0080960 A1 | 3/2019 | Ho et al. | |
| 2019/0109045 A1* | 4/2019 | Xie | H01L 21/823431 |
| 2019/0181088 A1* | 6/2019 | Lee | H01L 21/76837 |
| 2019/0311984 A1* | 10/2019 | Lin | H01L 21/76816 |
| 2021/0013096 A1* | 1/2021 | Ho | H01L 23/5283 |
| 2021/0050259 A1 | 2/2021 | Xie et al. | |
| 2021/0090952 A1* | 3/2021 | Freed | H01L 21/76897 |
| 2021/0343643 A1* | 11/2021 | Anderson | H01L 21/76816 |
| 2022/0165612 A1* | 5/2022 | Arnold | H01L 21/0337 |
| 2022/0285276 A1 | 9/2022 | Lenahan et al. | |

OTHER PUBLICATIONS

Extended European Search Report from European Application No. 22150660.3 dated Jun. 20, 2022, 8 pages.
U.S. Appl. No. 16/880,744, filed May 21, 2020, Guillaume Bouche.
U.S. Appl. No. 17/076,870, filed Oct. 22, 2020, Guillaume Bouche.
EPO Jun. 7, 2021 Extended European Search Report from European Application No. 20212636.5; 9 pages.
Hashemi, F., et al, "A New Resist for Area Selective Atomic and Molecular Layer Deposition on Metal-Dielectric Patterns", J. Phys. Chem. C 2014, 118, 19057-10962.
Love, C et al., "Self-Assembled Monolayers of Thiolates on Metals as a Form of Nanotechnology", Chem. Rev. 2005, 105, 1103-1169.
Semple, D., et al "Area-Selective Atomic Layer Deposition Assisted by Self-Assembled Monolayers: A Comparison of C, Co, W, and Ru", Chem. MAter, 2019, 31, 1635-1645.
Tokei et al., "How To solve teh BEOL RC delay problem?", Semiconductor Digest 2017; y pages retrieved from https://sst.semiconductor-gigest.com/2017/11/how-to-solve-the-beol-rc-delay-problem/ retrieved on May 6, 2020.

* cited by examiner

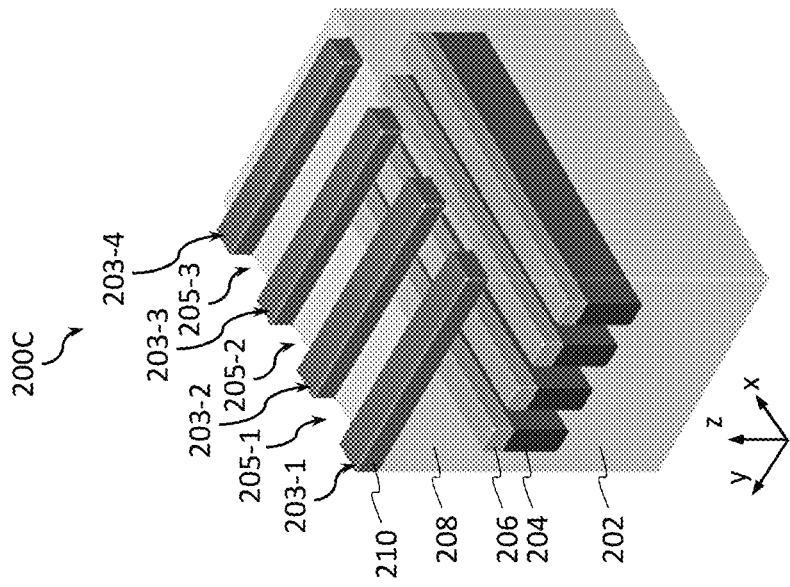
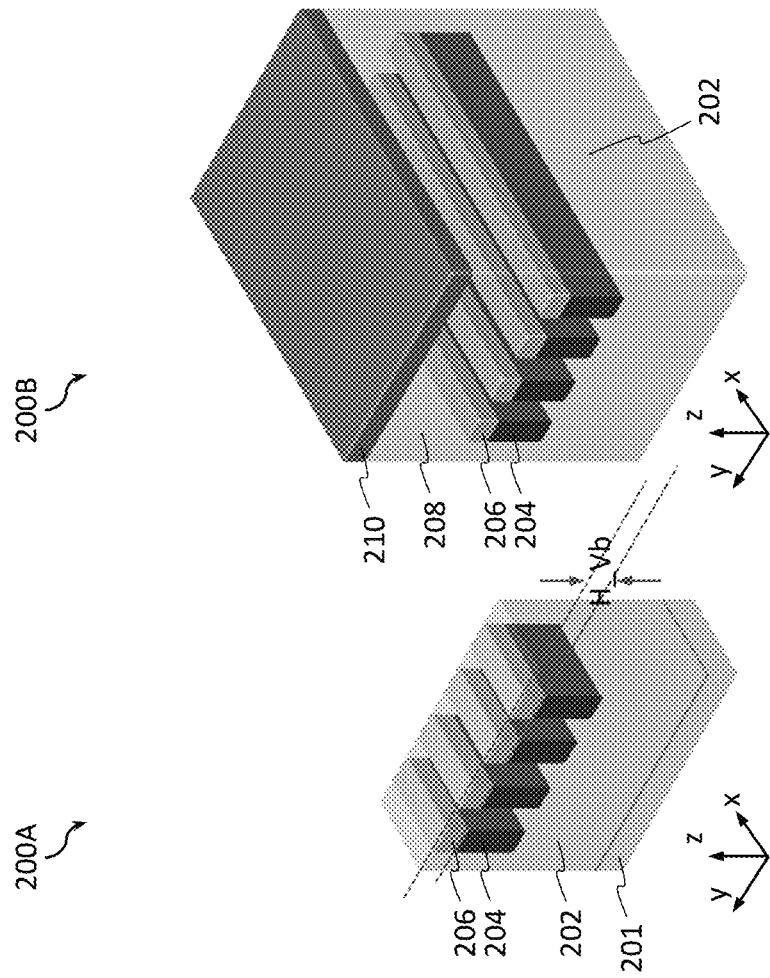
FIG. 2A  FIG. 2B  FIG. 2C

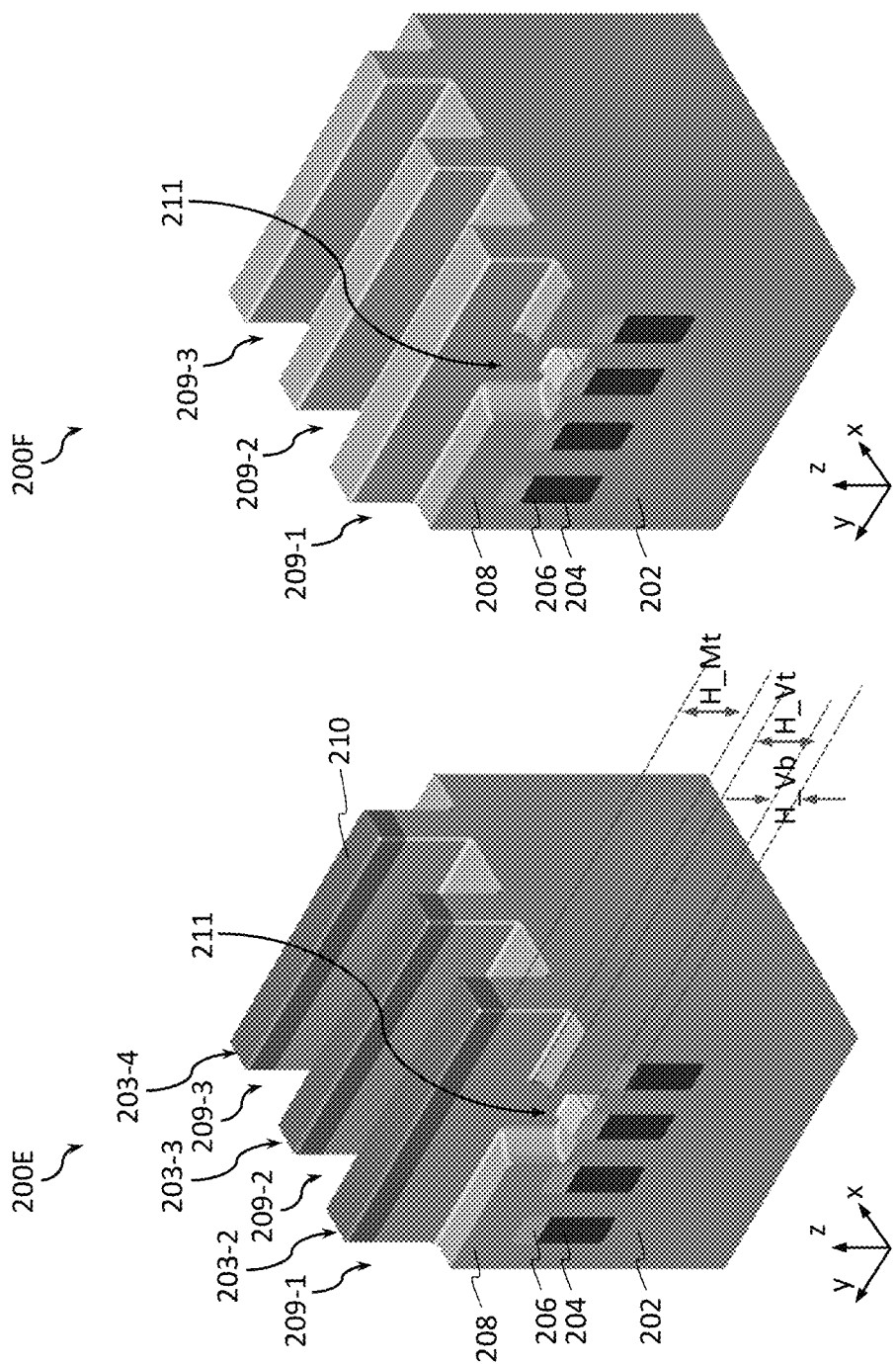

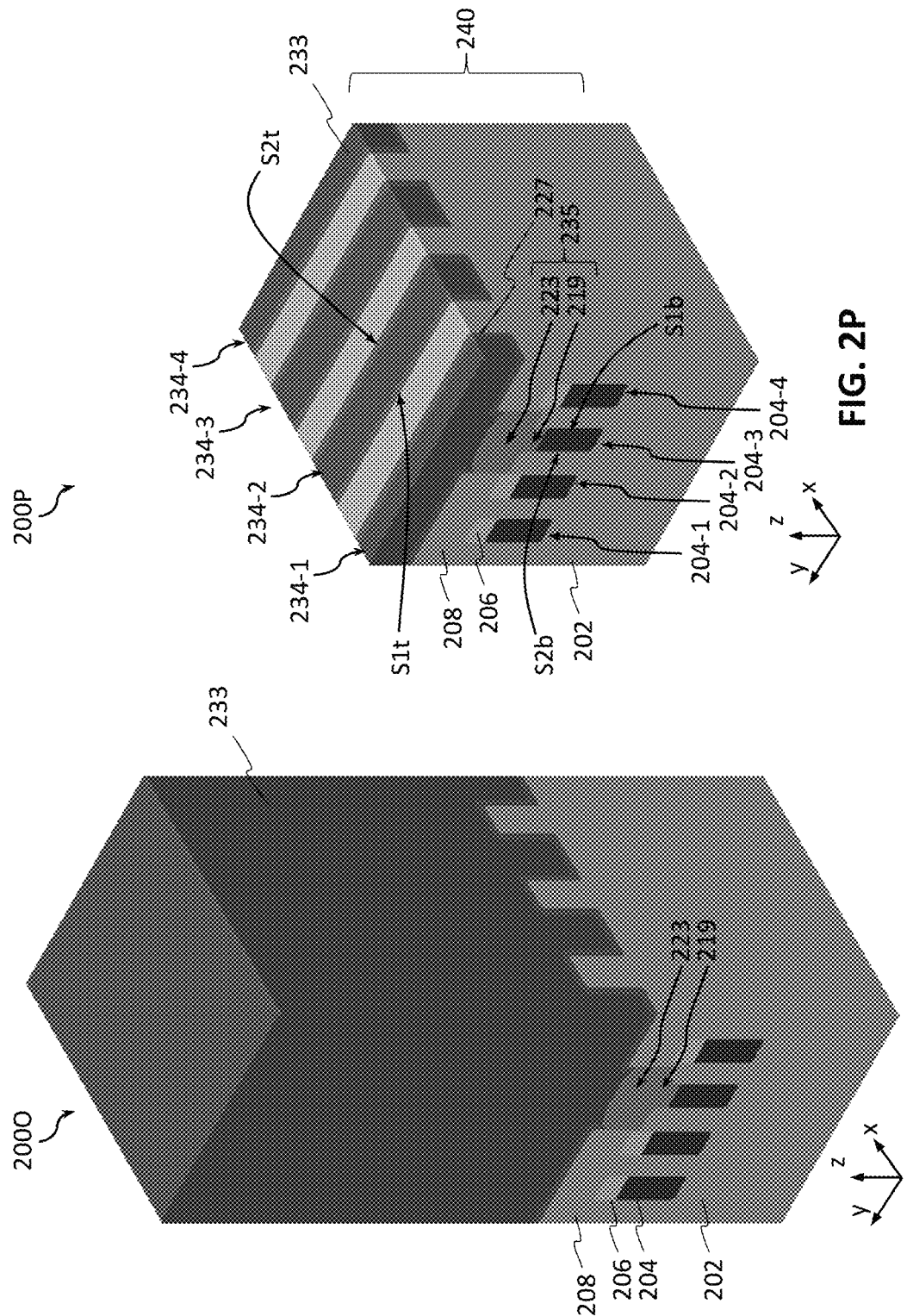

STACKED VIAS WITH BOTTOM PORTIONS FORMED USING SELECTIVE GROWTH

TECHNICAL FIELD

This disclosure relates generally to the field of semiconductor devices, and more specifically, to metallization stacks with integrated vias.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
FIG. 1 provides a flow diagram of an example method of using selective growth for forming bottom portions of stacked vias integrated in metallization stacks of integrated circuit (IC) structures, in accordance with some embodiments.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC structures with one or more stacked vias with bottom portions formed using selective growth for improved via integration in the back-end-of-line (BEOL) as described herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications.

ICs commonly include electrically conductive microelectronic structures, known in the art as interconnects, to provide electrical connectivity between various components. In this context, the term "metallization stack" may be used to describe a stacked series of layers of electrically conductive wires (sometimes referred to as "metal lines") which are electrically insulated from one another except for when/where they may need to be electrically connected. In a typical metallization stack, electrical connections between metal lines of different layers of a metallization stack (such layers sometimes referred to as "metal layers" or "metallization layers") are realized by means of vias filled with one or more electrically conductive materials, extending in a direction substantially perpendicular to the planes of the metal lines (i.e., extending in a vertical direction if the plane of the metal lines is considered to be a horizontal plane). Such vias are, therefore, integrated within the metallization stacks.

In the past, the sizes and the spacing of interconnects such as metal lines and vias have progressively decreased, and it is expected that in the future the sizes and the spacing of the interconnects will continue to progressively decrease, for at least some types of ICs (e.g., advanced microprocessors, chipset components, graphics chips, etc.). One measure of a size of a metal line is the critical dimension of the line width. One measure of the spacing of the metal lines is the line pitch, representing the center-to-center distance between the closest adjacent metal lines of a given layer of a metallization stack.

Smaller and smaller sizes and spacing of interconnects demands that performance of every interconnect is optimized. Particularly challenging are so-called "transition vias", which are vias that provide electrical connectivity between metal layers of different pitches. Typically, lower metal layers (i.e., layers of metallization stacks which are closer to the front-end-of line (FEOL) devices, such as transistors) are denser (i.e., have smaller pitches) than upper metal layers, which may be attributed to the lower metal layers having to provide electrical connectivity to various portions of a vast number of FEOL devices. For example, lower metal layers may have pitches on the order of 18-22 nanometers, while upper metal layers may have pitches on the order of 35-40 nanometers. Transition vias need to be designed to allow for the pitch transition, as well as the change in patterning strategy used to form metal lines of lower and upper metal layers (e.g., lower, denser metal lines may command innovative and more expensive fabrication processes while metal liners of upper layers may use classic Damascene fabrication).

Disclosed herein are methods for fabricating IC structures that include stacked vias providing electrical connectivity between metal lines of different layers of a metallization stack, as well as resulting IC structures. An example IC structure includes a first and a second metallization layers provided over a support structure (e.g., a substrate, a wafer, or a chip), where the first metallization layer includes a bottom metal line, the second metallization layer includes a top metal line, and the first metallization layer is between the support structure and the second metallization layer. The IC structure further includes a via that has a bottom via portion and a top via portion, where the top via portion is stacked over the bottom via portion (hence, the via may be referred to as a "stacked via"). The bottom via portion is coupled and self-aligned to the bottom electrically conductive line, while the top via portion is coupled and self-aligned to the top electrically conductive line. The bottom via portion is formed using selective growth, which refers to a process in which a self-assembled monolayer (SAM) material may be used to ensure that that an electrically conductive material of the bottom via portion is grown in a bottom-up process starting from the bottom of a via opening for the future bottom via portion while inhibiting or preventing nucleation of metal seeds of the electrically conductive material of the bottom via portion on the sidewalls of the via opening and on other surfaces of the IC structure. Such a stacked via with a bottom portion formed using selective growth may be particularly beneficial when used as a transition via. However, in general, stacked vias described herein are not limited to providing electrical connectivity between metal lines of metallization layers of different pitches (i.e., in various embodiments, the pitch of the first metallization layer that includes the bottom metal line as described herein may be the same or different from the pitch of the second metallization layer that includes the top metal line as described herein).

As used herein, the term "bottom metal line" refers to any electrically conductive structure/line that is provided in a layer of a metallization stack that is closer to the support structure than another layer of the metallization stack, while the term "top metal line" refers to any electrically conductive structure/line that is provided in the layer of the metallization stack that is above the layer of the bottom metal lines. In other words, the bottom metal lines are provided in a layer of the metallization stack that is between the support structure and the layer in which the top metal lines are provided. In various embodiments, such bottom and top metal lines may include electrically conductive structures other than lines/trenches (e.g., at least a portion of the bottom metal line may be a gate contact), and/or may be formed, or include, electrically conductive materials other than metals.

IC structures as described herein, in particular IC structures (e.g., metallization stacks) with one or more stacked vias with bottom portions formed using selective growth as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 2A-2P, such a collection may be referred to herein without the letters, e.g., as "FIG. 2."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of bottom metal lines, a certain number of top metal lines, a certain number of stacked vias, etc.), this is simply for ease of illustration, and more, or less, than that number may be included in an IC structure with one or more stacked vias with bottom portions formed using selective growth as described herein. Still further, various views shown in some of the drawings are intended to show relative arrangements of various elements therein. In other embodiments, various IC structures with one or more stacked vias with bottom portions formed using selective growth as described herein, or portions thereof, may include other elements or components that are not illustrated (e.g., transistor portions, various components that may be in electrical contact with any of the metal lines, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of IC structures with one or more stacked vias with bottom portions formed using selective growth as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC chip.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

EXAMPLE FABRICATION METHOD

FIG. 1 provides a flow diagram of an example method of using selective growth for forming bottom portions of stacked vias integrated in metallization stacks of IC structures, in accordance with some embodiments.

Although the operations of the method 100 are illustrated once each and in a particular order, the operations may be performed in any suitable order and repeated as desired. For example, one or more operations may be performed in parallel to manufacture, substantially simultaneously, multiple stacked vias with bottom portions formed using selective growth within a single IC structure or multiple IC structures with stacked vias with bottom portions formed using selective growth as described herein. In another example, the operations may be performed in a different order to reflect the structure of a particular device assembly in which one or more stacked vias with bottom portions formed using selective growth as described herein will be included.

In addition, the example manufacturing method 100 may include other operations not specifically shown in FIG. 1, such as various cleaning or planarization operations as known in the art. For example, in some embodiments, a support structure, as well as layers of various other materials subsequently deposited thereon, may be cleaned prior to, after, or during any of the processes of the method 100 described herein, e.g., to remove oxides, surface-bound organic and metallic contaminants, as well as subsurface contamination. In some embodiments, cleaning may be carried out using e.g., a chemical solution (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 100 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 100 may be illustrated with reference to the example embodiments shown in FIGS. 2A-2P, illustrating perspective views for various stages in the manufacture of an example IC structure that includes one or more stacked vias with bottom portions formed using selective growth, in accordance with some embodiments, for an example x-y-z coordinate system shown in these drawings. Although a certain number of a given element may be illustrated in some of FIGS. 2A-2P (e.g., a certain number of bottom metal lines, a certain number of top metal lines, and a certain number of stacked vias), this is simply for ease of illustration, and more, or less, than that number may be included in an IC structure fabricated according to the method 100. Still further, various views shown in FIGS. 2A-2P are intended to show relative arrangements of various elements therein. In other embodiments, various IC structures with one or more stacked vias with bottom portions formed using selective growth, or portions thereof, may include other elements or components that are not illustrated (e.g., transistor portions, various components that may be in electrical contact with any of the bottom metal line, the top metal line, and the via in between, etc.).

Turning to FIG. 1A, the method 100 may begin with a process 102 that includes providing, over a support structure, a plurality of bottom metal lines capped with a capping material. An IC structure 200A, depicted in FIG. 2A, illustrates an example result of the process 102. As shown in FIG. 2A, the IC structure 200A may include a support structure 201 with a layer of a dielectric material 202 provided thereon, which layer includes a plurality of bottom metal lines 204 formed of a first electrically conductive (M1) material, each bottom metal line 204 capped with a capping material 206.

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 201 may include any such substrate, possibly with some layers (e.g., lower level metallization layers) and/or devices already formed thereon (e.g., FEOL devices), not specifically shown in the present figures, providing a suitable surface for forming metallization stacks that may include one or more stacked vias with bottom portions formed using selective growth for improved via integration in the BEOL. In the following drawings of FIG. 2, the support structure 201 is not labeled specifically.

In some embodiments, the dielectric material 202 may be a low-k dielectric material. Examples of the low-k dielectric materials that may be used as the dielectric material 202 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric material 202 include organic polymers such as polyimide, benzocyclobutene, polynorbornenes, perfluorocyclobutane, or polytetrafluoroethylene (PTFE). Still other examples of low-k dielectric materials that may be used as the dielectric material 202 include silicon-based polymeric dielectrics such as hydrogen silsesquioxane (HSQ) and methylsilsesquioxane (MSQ). Other examples of low-k materials that may be used in the dielectric material 202 include various porous dielectric materials, such as for example porous silicon dioxide or porous carbon-doped silicon dioxide, where voids or pores are created in a dielectric in order to reduce the overall dielectric constant of the material, since voids or pores can have a dielectric constant of nearly 1. The dielectric material 202 may be deposited in the process 102 using a technique such as spin-coating, dip-coating, atomic layer deposition (ALD), chemical vapor deposition (CVD), physical vapor deposition (PVD) (e.g., evaporative deposition, magnetron sputtering, or e-beam deposition).

In general, various electrically conductive materials described herein, e.g., the M1 material of the bottom metal lines 204, may include one or more of any suitable electrically conductive materials (conductors). Such materials may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, molybdenum, hafnium, zirconium, titanium, tantalum, and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g., hafnium nitride, zirconium nitride, titanium nitride, tantalum nitride, and aluminum nitride) of one or more metals. Various electrically conductive materials described herein, e.g., the M1 material of the bottom metal lines 204, may be deposited using a deposition technique such as, but not limited to, ALD, CVD, PVD (e.g., evaporative deposition, magnetron sputtering, or e-beam deposition), plasma enhanced CVD (PECVD), or electroplating.

In general, the capping material 206 may include one or more of any suitable materials that may be sufficiently etch-selective with respect to the surrounding dielectric material 202 in order to serve as a mask for patterning the dielectric material 202. As is known in the field of semiconductor manufacturing, etch selectivity between different materials may be used to ensure, e.g., that patterning using masks may be performed, where two materials may be described as "sufficiently etch-selective" if etchants used to etch one material do not substantially etch the other material, and vice versa. In various embodiments, the capping material 206 may include materials such as aluminum nitride, aluminum oxide, silicon nitride, or silicon carbon nitride, as long as the capping material 206 is sufficiently etch-selective with respect to the dielectric material 202. Various mask materials described herein, e.g., the capping material 206, may be deposited using a deposition technique such as, but not limited to, spin-coating, dip-coating, ALD, CVD, or PVD.

In various embodiments, the bottom metal lines 204 may be provided in the process 102 using any suitable process such as a direct metal etch, subtractive patterning (e.g., Damascene fabrication), etc. The capping material 206 may then be provided by, e.g., recessing the bottom metal lines 204 below the upper surface of the dielectric material 202, filling the recesses with the capping material 206, and, possibly, performing a planarization operation to remove the excess of the capping material 206 so that the upper surfaces of the capping material 206 above each of the bottom metal lines 204 are flush with the upper surface of the dielectric material 202. Alternatively the capping material 206 may be deposited on an unpatterned layer of the bottom metal lines 204, and both then get patterned at the same time in the case of the direct metal etch approach.

A thickness of the capping material 206 (in this case, a dimension measured along the z-axis of the example coordinate system shown in FIG. 2A) deposited in the process 102 may be substantially equal to a height of the bottom via portion of a stacked via to be formed in later fabrication processes. The height of the bottom via portion of the future stacked via is labeled in FIG. 2A as "H_Vb." For example, in some embodiments, the thickness of the capping material 206 may be between about 2 and 50 nanometers, including all values and ranges therein, e.g., between about 3 and 30 nanometers, or between about 5 and 20 nanometers.

The method 100 may then proceed with a process 104 that includes depositing a dielectric material and a mask material over the IC structure formed in the process 102. An IC structure 200B, depicted in FIG. 2B, illustrates an example result of the process 104. As shown in FIG. 2B, the IC structure 200B may include a layer of a dielectric material 208 provided over the bottom metal lines 204 capped with the capping material 206, as well as a layer of a mask material 210 thereover. In some embodiments, the dielectric material 208 may include any of the materials, and be provided using any deposition techniques, described with reference to the dielectric material 202, where the exact material composition of these two dielectric materials may be either substantially the same or different. In some embodiments, the mask material 210 may include any of the materials, and be provided using any deposition techniques, described with reference to the capping material 206, where the exact material composition of these two mask materials may be either substantially the same or different. In general, the mask material 210 may include one or more of any suitable materials that may be sufficiently etch-selective with respect to the underlying dielectric material 208 in order to serve as a mask for patterning the dielectric material 208.

A thickness of the dielectric material 208 (in this case, a dimension measured along the z-axis of the example coordinate system shown in the present drawings) deposited in the process 104 may be substantially equal to a sum of a height of the top metal line to be formed in the dielectric material 208 and a height of the top via portion of a stacked via to also be formed in the dielectric material 208 in later fabrication processes. For example, in some embodiments, the thickness of the dielectric material 208 may be between about 20 and 300 nanometers, including all values and ranges therein, e.g., between about 30 and 150 nanometers, or between about 50 and 100 nanometers. The thickness of the mask material 210 may be between about 2 and 50 nanometers, including all values and ranges therein, e.g., between about 3 and 30 nanometers, or between about 5 and 20 nanometers.

Next, the method 100 may proceed with a process 106 that includes patterning the mask material deposited in the process 104 to form what may be referred to as a "top metal line pattern," defining shapes and locations of one or more top metal lines to be formed in the dielectric material deposited in the process 104. An IC structure 200C, depicted in FIG. 2C, illustrates an example result of the process 106. As shown in FIG. 2C, the mask material 210 may be patterned to form one or more mask lines 203 and one or more openings 205 for future top metal lines, the openings 205 being regions where the mask material 210 has been removed. The shapes and locations of the openings 205 may correspond to, or define, the shapes and locations of one or more top metal lines to be formed in the dielectric material 210 in a later process. In some embodiments, the length of the openings 205 may be substantially perpendicular to the bottom metal lines 204, as shown in FIG. 2C with the bottom metal lines 204 extending in directions parallel to the x-axis of the example coordinate system shown and the openings 205 extending in directions parallel to the y-axis of the example coordinate system shown, although this relative orientation may be different in other embodiments of the IC structure 200. In various embodiments, the top metal line pattern of the mask material 210 may be formed in the process 106 using any suitable etching technique (e.g., a dry etch, such as e.g., radio frequency (RF) reactive ion etch (RIE) or inductively coupled plasma (ICP) RIE) in combination with lithography (e.g., photolithography or electron-beam lithography) to define the locations and the sizes of the lines 203 and the openings 205 in the mask material 210. To that end, any suitable etch process for etching the mask material 210 without substantially etching the dielectric material 208 may be used in the process 106 to define the openings 205.

Figure 2D:
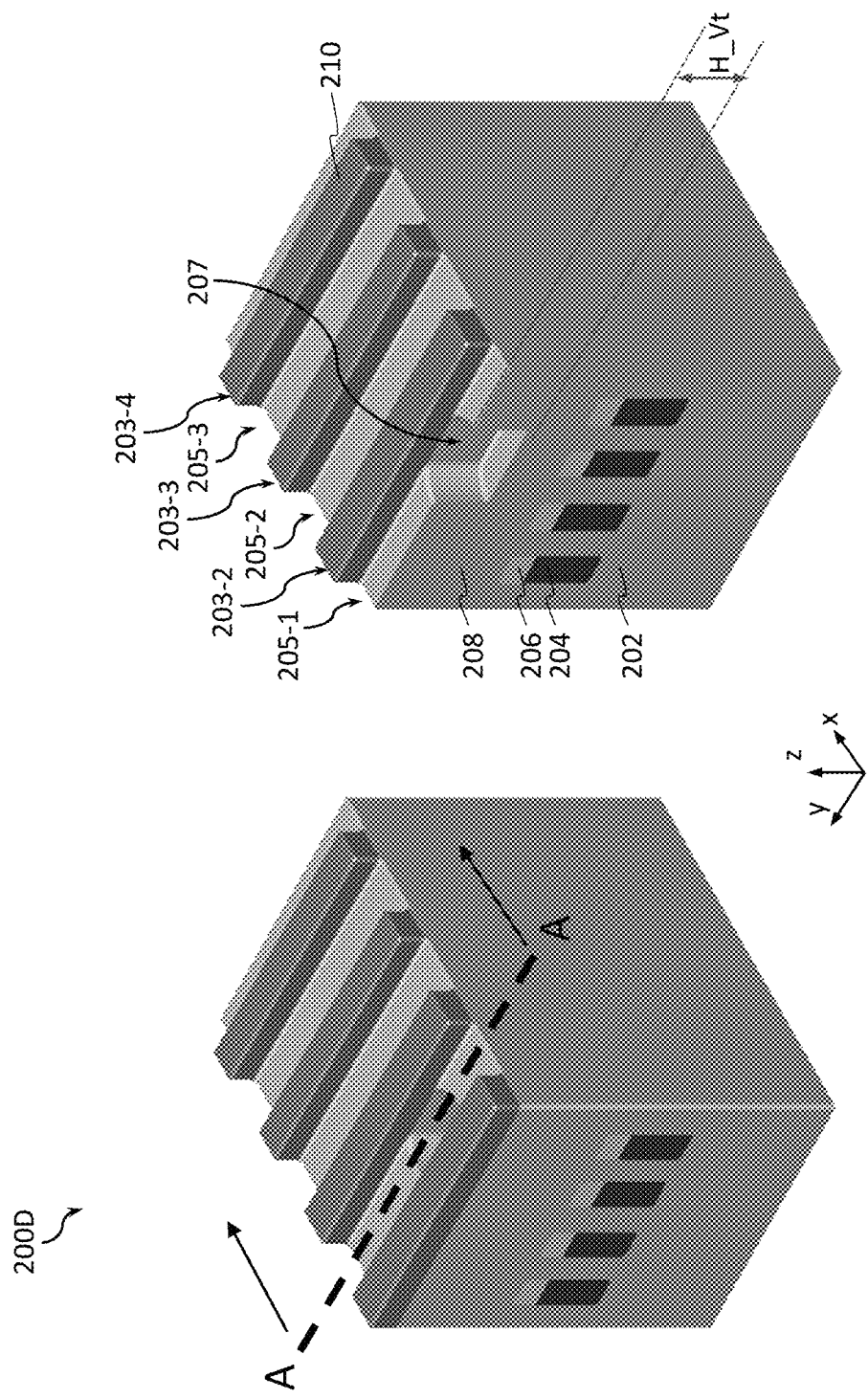
FIGS. 2A-2P illustrate top-down and cross-sectional side views at various stages in the manufacture of an example IC structure according to the method of FIG. 1, in accordance with some embodiments.

The method 100 may then proceed with a process 108 that includes forming a via opening by recessing the dielectric material deposited in the process 104 through an opening of the top metal line pattern formed in the process 106. An IC structure 200D, depicted in FIG. 2D, illustrates an example result of the process 108. FIG. 2D illustrates two views of the IC structure 200D—the one shown on the left side illustrates a plane AA, which is a cross-sectional plane along which the y-z cross-sections of the view shown on the right side of FIG. 2D, as well as all of the subsequent perspective views of FIG. 2, are shown. The view of the IC structure 200D shown on the left side of FIG. 2D does not illustrate the reference numerals in order to not clutter the drawing, but the view of the IC structure 200D shown on the right side of FIG. 2D illustrates that the cross-section AA is taken along the opening 205-1 formed in the process 106. As shown in FIG. 2D, a via opening 207 may be formed by recessing the dielectric material 208 through the opening 205-1 that was formed in the process 106.

A depth of the recess in the dielectric material 208 (in this case, a dimension measured along the z-axis of the example coordinate system shown in FIG. 2D) formed to create the via opening 207 in the process 108 may be substantially equal to a height of the top via portion of a stacked via to be formed in a later fabrication process. The height of the top via portion of the future stacked via is labeled in FIG. 2D as "H_Vt." For example, in some embodiments, the depth of the via opening 207 may be between about 2 and 50 nanometers, including all values and ranges therein, e.g., between about 3 and 30 nanometers, or between about 5 and 20 nanometers. In various embodiments, the via opening 207 may be formed in the process 108 using any suitable etching technique (e.g., a dry etch) in combination with lithography (e.g., photolithography or electron-beam lithography) to define the locations and the sizes of the via opening 207 in the dielectric material 208. To that end, any suitable etch process for etching the dielectric material 208 without substantially etching the mask material 210 may be used in the process 108 to define the via opening 207. A timed etch may be used to limit the depth of the recess of the via opening 207.

The method 100 may also include a process 110 in which the dielectric material deposited in the process 104 is removed through the openings of the top metal line pattern formed in the process 106 to expose a cap of one (or at least one) of the bottom metal lines 204 through the via opening. An IC structure 200E, depicted in FIG. 2E, illustrates an example result of the process 110, where the dielectric material 208 not covered by the top metal line pattern of the mask material 210 is removed, thus forming openings 209 for future top metal lines. The depth of the openings 209 (in this case, a dimension measured along the z-axis of the example coordinate system shown in FIG. 2E) may be substantially equal to the height of the top metal lines to be formed in a later fabrication process, labeled in FIG. 2E as "H_Mt." Because the etch process used in the process 110 removes the dielectric material 208 but there was already the via opening 207 formed in the dielectric material 208, the via opening moves effectively lower within the dielectric material (i.e., the via opening 207 is moved lower to start at the bottom of one of the top metal line openings 209, forming a via opening 211), until the capping material 206 of one of the bottom metal lines 204 is exposed. In various embodiments, the process 110 may involve using any suitable etching technique (e.g., a dry etch) for etching the dielectric material 208 without substantially etching the mask material 210 and without substantially etching the capping material 206. In other embodiments, the order of the processes 108 and 110 may be reversed, e.g., first a timed etch may be used to remove the dielectric material 208 exposed by the openings 205 in the mask material 210, thus forming the top metal line openings 209, and then an additional etch in combination with additional lithography may be used to further etch the dielectric material 208 to form the via opening 211.

As a result of the etching of the processes 108 and 110, the top metal line openings 209 with the locations and the dimensions for the future top metal lines are formed, and, furthermore, the via opening 211 with the location and the dimensions for the future bottom portion of a stacked via is formed so that the capping material 206 over one of the bottom metal lines 204 is exposed at the bottom of the via opening 211. FIG. 2E illustrates that in some embodiments the dielectric material around the capping material 206 may be over-etched, but in other embodiments the top of the capping material 206 at the bottom of the via opening 211 may be flush with the dielectric material around it.

Next, the method 100 may proceed with a process 112 that includes removing the mask material of the top metal line pattern. An IC structure 200F, depicted in FIG. 2F, illustrates an example result of the process 112. As shown in FIG. 2F, the mask material 210 may be removed. In various embodiments, the process 112 may involve using any suitable etching technique (e.g., a dry etch) for etching the mask material 210 without substantially etching the dielectric material 208 or the capping material 206.

Figure 2H:
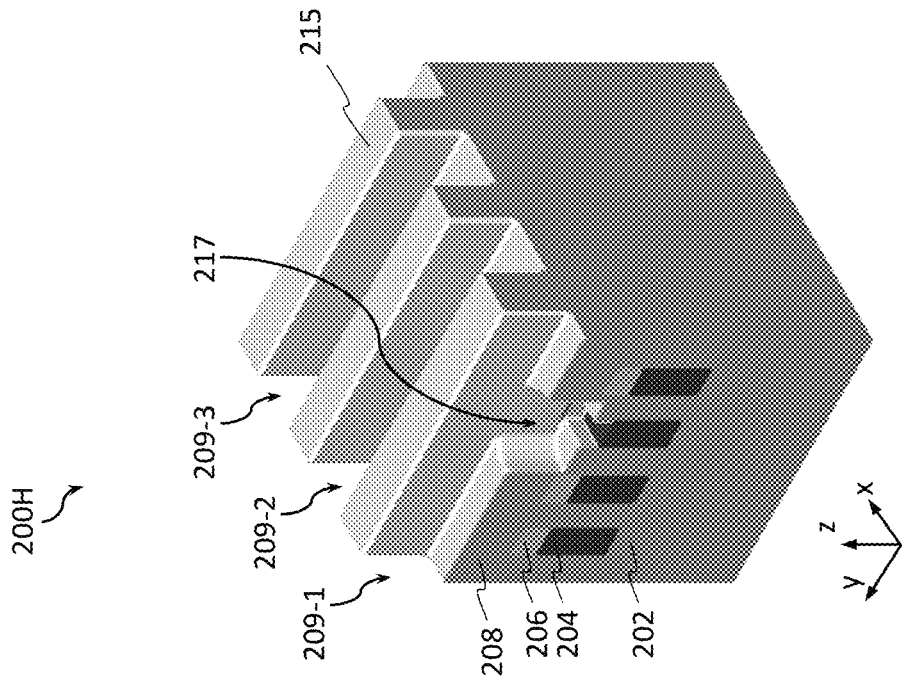
Figure 2G:
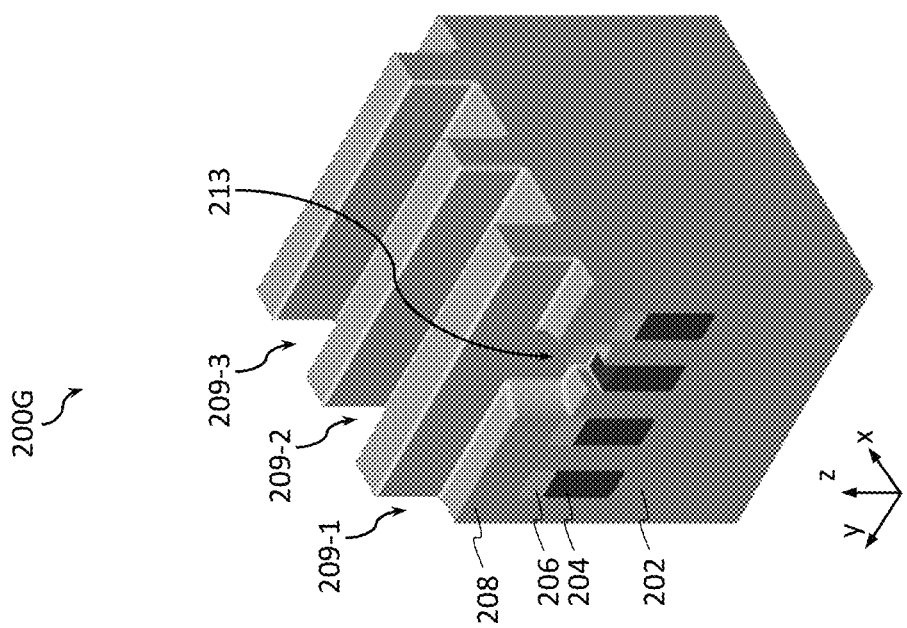

The method 100 may further include a process 114, in which the capping material 206 exposed by the via opening 211 is removed. An IC structure 200G, depicted in FIG. 2G, illustrates an example result of the process 114. As shown in FIG. 2G, as a result of removing the capping material 206 from the bottom of the via opening 211, the via opening 211 becomes deeper and is now labeled as a via opening 213. In various embodiments, the process 114 may involve using any suitable etching technique (e.g., a dry etch) for etching the capping material 206 without substantially etching the dielectric material 208. In some embodiments, the order of the processes 112 and 114 may be reversed to arrive at the IC structure 200G.

The method 100 may then proceed with a process 116, in which a first SAM material may be deposited on dielectric materials, selective to electrically conductive materials (i.e. deposited on the exposed dielectric materials but not substantially deposited on the exposed electrically conductive materials). An IC structure 200H, depicted in FIG. 2H, illustrates an example result of the process 116. As shown in FIG. 2H, a first SAM material 215 may be provided on all surfaces of the IC structure 200G, except for the portion of the bottom metal line 204 exposed at the bottom of the via opening 213 because that portion is of an electrically conductive material, not a dielectric material.

Any suitable conformal deposition technique may be used to provide the first SAM material 215 in the process 116, such as ALD or CVD, as long as the first SAM material 215 is such that the molecules of the first SAM material 215 bond to dielectric materials, forming substantially a single monolayer (or a few monolayers) of molecules at the exposed surfaces of the dielectric materials, without substantially bonding to electrically conductive materials. In some embodiments, the first SAM material 215 may include any materials suitable for grafting on dielectric via sidewall of the via opening 213, thus transforming the via opening 213 to a lined via opening 217, to reduce/prevent metal nucleation and enable bottom-fill of the lined via opening 217 in a subsequent fabrication process. Some example materials of the first SAM material 215 include, but are not limited to, alkoxy, halogenated (chloro-, fluoro- etc.) and amino silane SAMs. In some embodiments, a thickness of the first SAM material 215 deposited in the process 116 may be between about 0.2 and 4 nanometers, including all values and ranges therein, e.g., between about 0.3 and 2 nanometers.

Figure 1B:
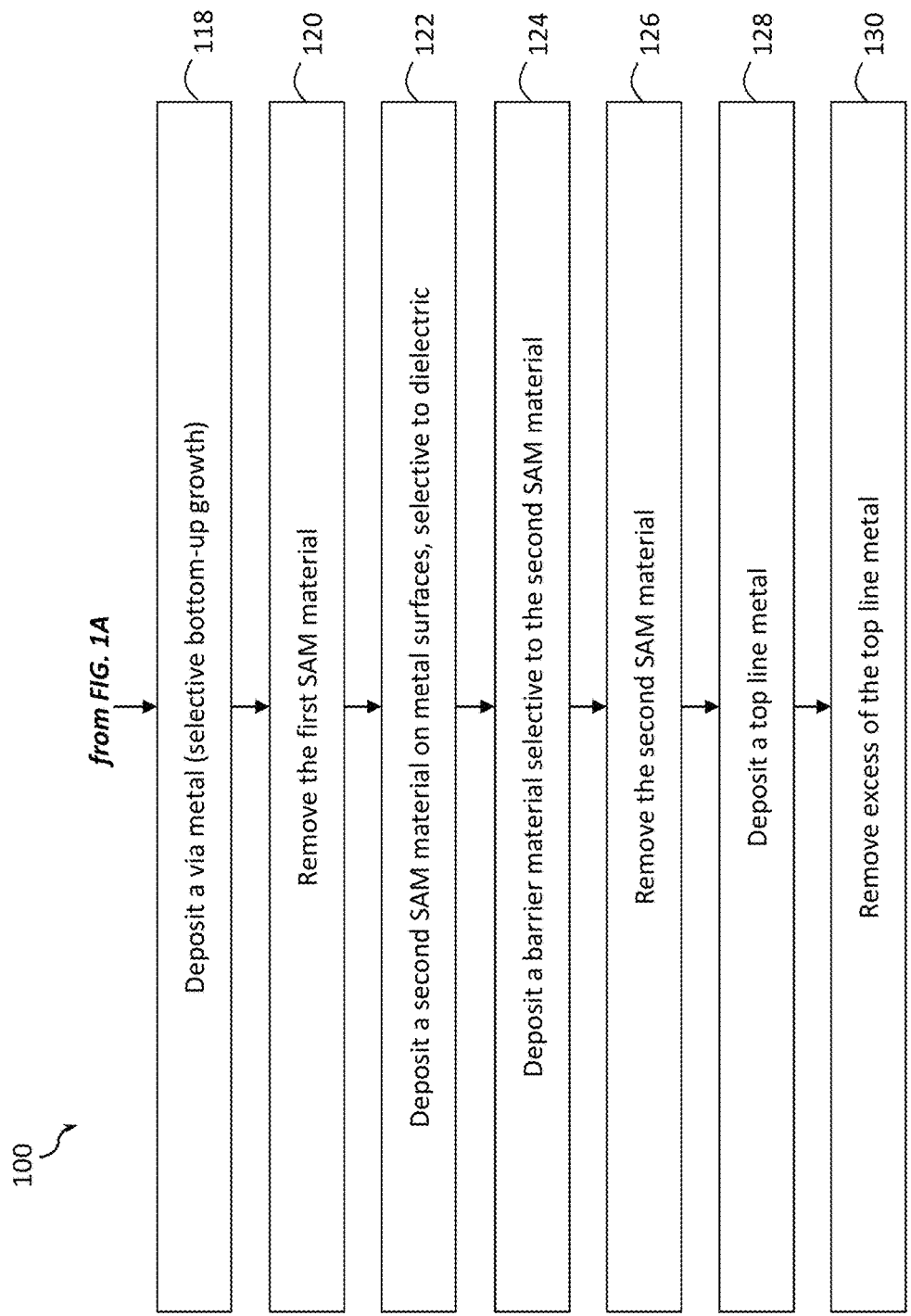
Figure 2J:
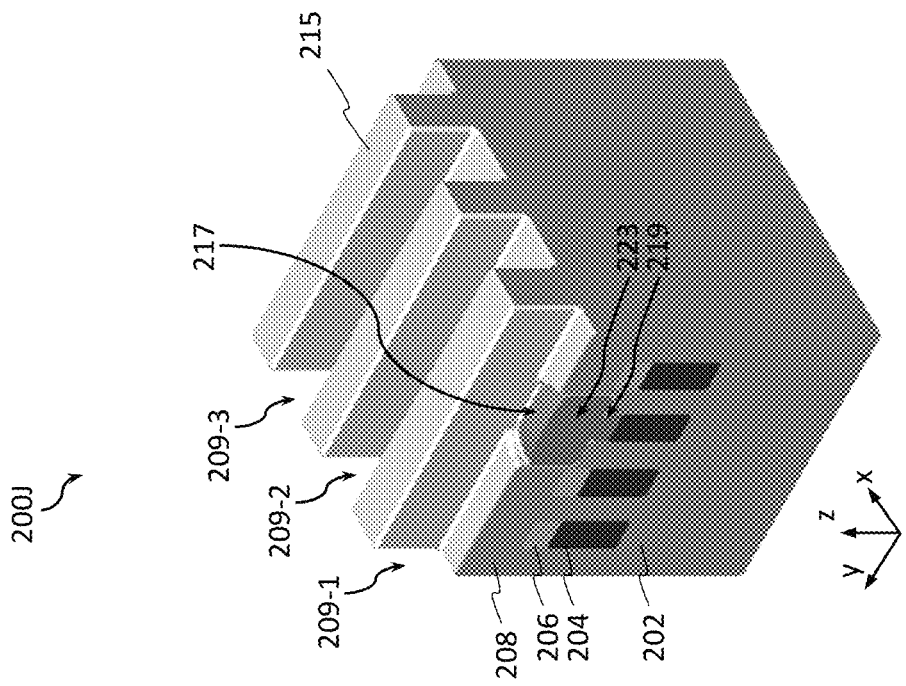
Figure 2I:
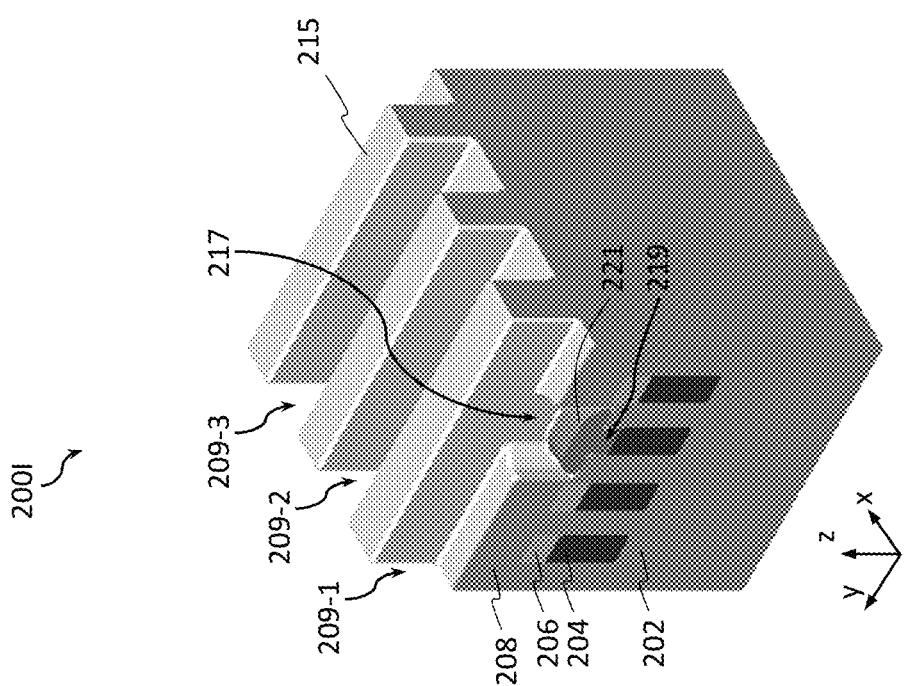

Continuing with the illustration of the method 100 on FIG. 1B, the method 100 may further proceed with a process 118, which includes depositing a second electrically conductive (M2) material into the lined via opening 217. An IC structure 200I, depicted in FIG. 2I, and an IC structure 200J, depicted in FIG. 2J, illustrate an example result of the process 118. As shown in FIG. 2I, in the IC structure 200I, a bottom via portion 219 of the future stacked via is formed when an M2 material 221 is deposited in the region of the via opening 217 from which the capping material 206 was removed. As shown in FIG. 2J, in the IC structure 200J, a top via portion 223 of the future stacked via is formed when the M2 material 221 is deposited in the remainder of the via opening 217.

In various embodiments, the M2 material 221 may include one or more electrically conductive materials of the materials described with reference to the M1 material of the bottom metal lines 204. In general, the material composition of the M2 material 221 may, but does not have to be, the same as the material composition of the M1 material of the bottom metal lines 204. Any suitable process may be used to deposit the M2 material 221 in the lined via opening 217, such as any of the processes described with reference to the M1 material.

Figure 2L:
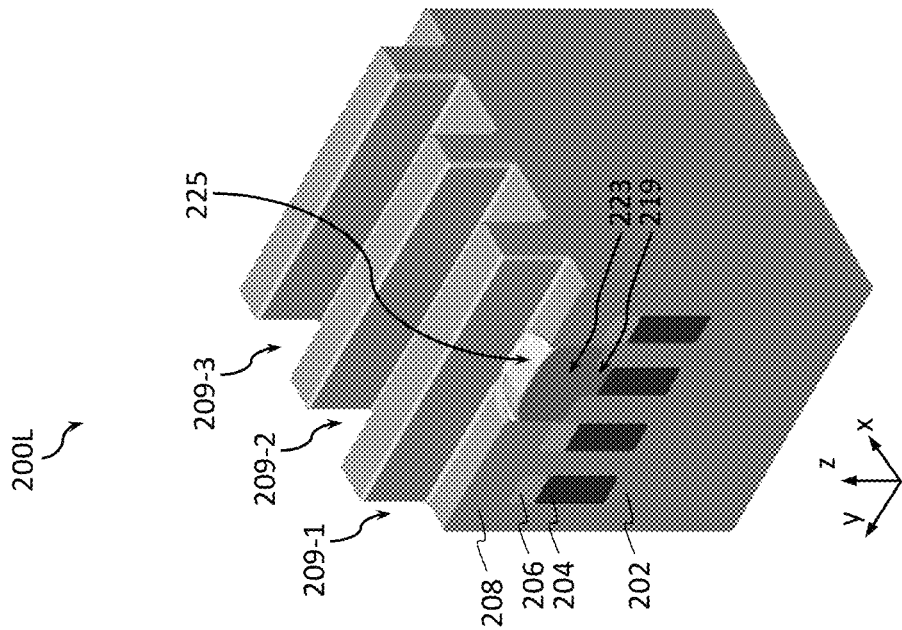
Figure 2K:
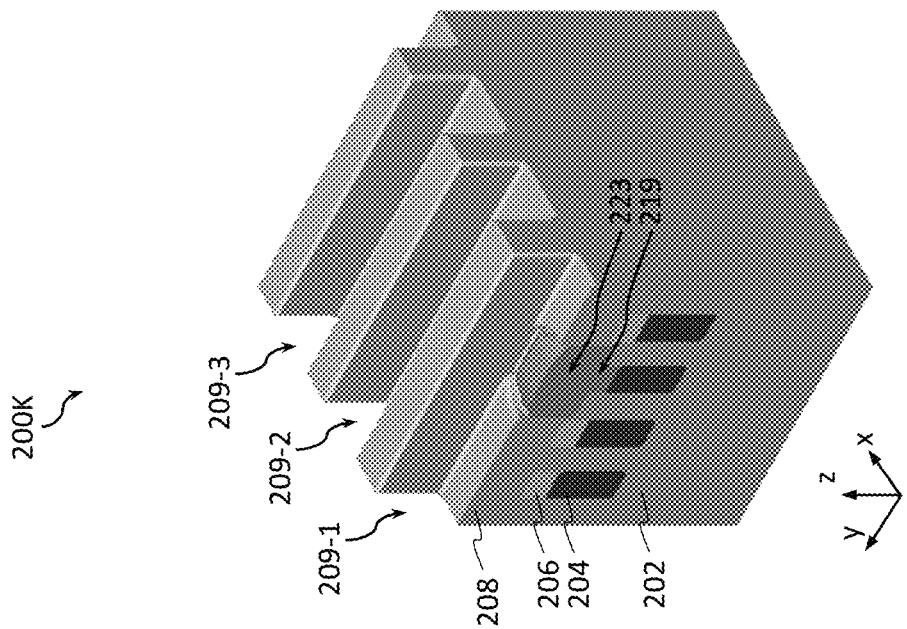

In the embodiments when the first SAM material 215 was deposited on the sidewalls of the via opening 217, the M2 material 221 may be deposited in the process 118 by a selective bottom-up process in which the M2 material 221 is deposited from the bottom of the lined via opening 217 (i.e., from the upper surface of the M1 material of the bottom metal line 204 exposed by the via opening 217) and grows upwards, while the first SAM material 215 advantageously inhibits nucleation of metal seeds of the M2 material 221 on the sidewalls of the lined via opening 217 and on other surfaces of the IC structure 200J that were covered with the first SAM material 215. In such embodiments, the method 100 may also include a process 120, in which the exposed portions of the first SAM material deposited in the process 118 are removed once the via opening 217 has been filled with the M2 material 221. An IC structure 200K, depicted in FIG. 2K, illustrates an example result of the process 120. As shown in FIG. 2K, in the IC structure 200K, the first SAM material 215 is removed everywhere except where it is over the sidewalls of the lined via opening 217, between the dielectric material 208 and the M2 material 221 that was deposited in the process 118.

Using the first SAM material 215 may be advantageous in some embodiments in terms of facilitating a selective bottom-up deposition of the M2 material 221 from the top surface of the bottom metal line 204 exposed by the via opening 217 by inhibiting nucleation of metal seeds over the sidewall of the via opening 217. However, in other embodiments, the first SAM material 215 as described herein may be omitted, in which case both the process 116 and the process 120 are omitted and the process 118 results in an IC structure that is substantially the same as the IC structure 200K, shown in in FIG. 2K, except that it does not include the first SAM material 215 and the dielectric material 208 may be in contact with the M2 material 221 that was deposited in the process 118. Thus, although all of the subsequent drawings following FIG. 2K illustrate the first SAM material 215, the IC structures illustrated in these drawings could also be implemented without it.

It should be noted that the processes 102-118 illustrate an embodiment of the method 100 where both the top metal line openings 209 and the via opening 217 are patterned before the M2 material 221 of the via is deposited, a process commonly referred to as dual-Damascene.

The method 100 may further include a process 122, in which a second SAM material may be deposited on electrically conductive materials, selective to dielectric materials (i.e., deposited on the exposed electrically conductive materials but not substantially deposited on the exposed dielectric materials). An IC structure 200L, depicted in FIG. 2L, illustrates an example result of the process 122. As shown in FIG. 2L, in the IC structure 200L, a second SAM material 225 may be provided on all surfaces of the IC structure 200K which are not surfaces of dielectric materials. Thus, the second SAM material 225 is only provided over the M2 material 221 of the lined via opening 217 because exposed surfaces of the dielectric material 208 are all dielectric materials. Any suitable conformal deposition technique may be used to provide the second SAM material 225 in the process 122, such as ALD or CVD, as long as the second SAM material 225 is such that the molecules of the second SAM material 225 bond to electrically conductive materials, forming substantially a single monolayer (or a few monolayers) of molecules at the exposed surfaces of the electrically conductive materials, without substantially bonding to the dielectric materials. In some embodiments, the second SAM material 225 may include materials suitable for grafting to metal via top and reducing/preventing TaN barrier to deposit such as aniline and short chained phosphonic acids. In some embodiments, a thickness of the second SAM material 225 over the M2 material 221 (i.e., a dimensioned measured along the z-axis of the example coordinate system shown in FIG. 2L) may be between about 0.2 and 4 nanometers, including all values and ranges therein, e.g., between about 0.3 and 4 nanometers.

Figure 2N:
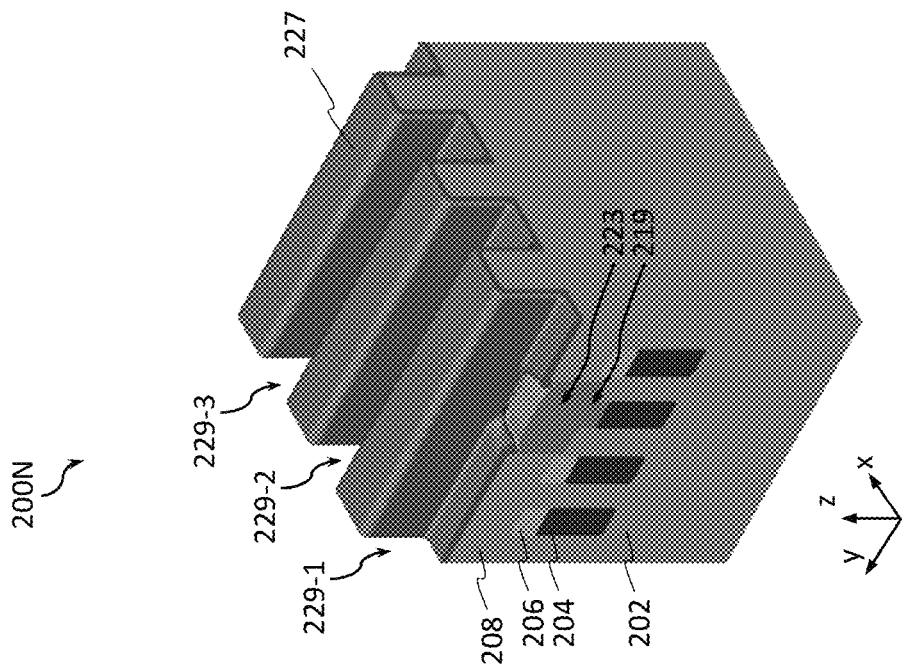
Figure 2M:
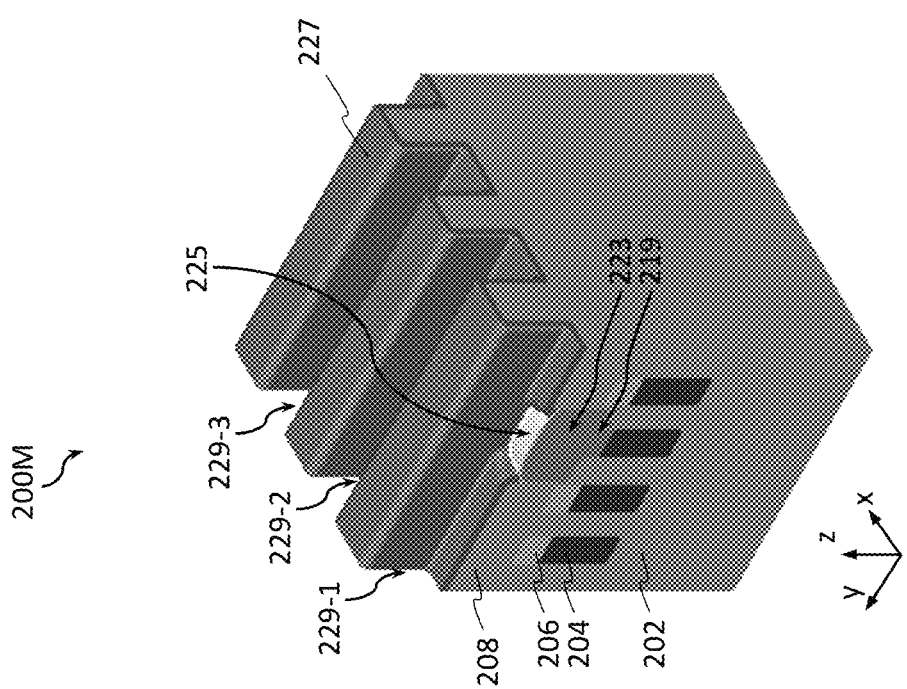

The method 100 may continue with a process 124, in which a barrier material may be deposited selective to the second SAM material deposited in the process 122 (i.e., deposited on all of the exposed materials except for the exposed second SAM material). An IC structure 200M, depicted in FIG. 2M, illustrates an example result of the process 124. As shown in FIG. 2M, the IC structure 200M includes a barrier material 227 that is deposited over the sidewalls and the bottom of the top metal line openings 209, thus forming smaller, lined, top metal line openings 229, where the second SAM material 225 substantially prevents deposition of the barrier material 227 over the upper surface of the M2 material 221 in the via opening 217. Any suitable conformal deposition technique may be used to provide the barrier material 227 in the process 124, such as ALD or CVD.

In some embodiments, the barrier material 227 may include materials such as titanium nitride, tantalum nitride, or silicon nitride. In general, the barrier material 227 may include any material through which the atoms of the electrically conductive material of the top metal line (e.g., copper), deposited in a later process of the method 100, may not substantially diffuse. Thus, the barrier material 227 is intended to provide hermiticity in terms of reducing or eliminating diffusion of the atoms of the electrically conductive material of the top metal line into the dielectric stack and reaching the support structure 201 (that's why the lined top metal line openings 229 with the barrier material 227 may be referred to as a "hermetically lined top metal line openings" 229).

In some embodiments, a thickness of the barrier material 227 (i.e., a dimension measured along the z-axis for the barrier material 227 provided over the horizontal surfaces and a dimension measured in an x-y plane for the barrier material 227 provided over the vertical surfaces shown in FIG. 2M) may be between about 0.5 and 4 nanometers. In some implementations, the thickness of the barrier material 227 may be selected to be thick enough to substantially prevent diffusion of the atoms of the electrically conductive material of the top metal line while being thin enough so that the lined top metal line openings 229 are still large enough to have sufficient conductivity when the lined top metal line openings 229 are filled with an electrically conductive material.

The method 100 may then proceed with a process 126, in which the second SAM material deposited in the process 122 is removed before the top metal line openings 229 are filled with an electrically conductive material. An IC structure 200N, depicted in FIG. 2N, illustrates an example result of the process 126. As shown in FIG. 2N, the IC structure 200N, the second SAM material 225 is removed, exposing the upper surface of the M2 material 221 in the lined via opening 217. In some embodiments, processes such as H2 plasma may be used to remove the second SAM material 225 in the process 126.

Next, the method 100 may include a process 128, that includes depositing a third electrically conductive (M3) material into the lined top metal line openings 229. An IC structure 200O, depicted in FIG. 2O, illustrates an example result of the process 128. As shown in FIG. 2O, in the IC structure 200O, an M3 material 233 is provided in the lined top metal line openings 229, including the top metal line opening 229-1 in which the second SAM material 225 has been removed to expose the M2 material 221 in the lined via opening 217. In various embodiments, the M3 material 233 may include one or more electrically conductive materials (e.g., one electrically conductive material may line the sidewalls of the lined top metal line openings 229 and another electrically conductive material may at least partially fill the remainder of the openings 229), and may include any of the materials described with reference to the M1 material of the bottom metal lines 204. In general, the material composition of the M3 material 233 may, but does not have to, be the same as the material composition of the M1 material of the bottom metal lines 204 or the M2 material 221. Any suitable process may be used to deposit the M3 material 233 in the lined top metal line openings 229, such as any of the processes described with reference to the M1 material of the bottom metal lines 204.

The method 100 may end with a process 130, in which excess of the M3 material 233 is removed to form top metal lines. An IC structure 200P, depicted in FIG. 2P, illustrates an example result of the process 130. As shown in FIG. 2P, in the IC structure 200P, excess of the M3 material 233 is removed, e.g., so that the M3 material 233 is only provided in the lined top metal line openings 229 but not over the upper surface of the barrier material 227 or over the dielectric material 208, to form top metal lines 234. In some embodiments, any suitable process, such as CMP, may be used to remove the excess of the M3 material 233 to form the top metal lines 234.

As also shown in FIG. 2P, the top via portion 223 of the M2 material 221 is coupled to one of the top metal lines 234 (namely, to the top metal line 234-1 of FIG. 2P), while the bottom via portion 219 of the M2 material 221 is coupled to one of the bottom metal lines 204 (namely, to the bottom metal line 204-3 of FIG. 2P), where together the top via portion 223 and the bottom via portion 219 form a stacked via 235.

Together, the bottom metal lines 204, the top metal lines 234, and the stacked via 235 having one end coupled to the bottom metal line 204-3 and another end coupled to the top metal line 234-1, together with the respective dielectric materials surrounding these structures, form a metallization stack 240 of the IC structure 200P. The use of the second SAM material 225 in the method 100 may enable an improved integration of the stacked via 235 in the metallization stack 240, where the stacked via 235 is electrically coupled between/to the bottom metal line 204-3 and the top metal line 234-1.

The use of the method 100 may leave several characteristic features in the IC structure 200P. These features will now be described with reference to FIG. 2P and with reference to FIG. 3, illustrates various views of a stacked via of an example IC structure manufactured according to the method of FIG. 1, in accordance with some embodiments.

Figure 3:
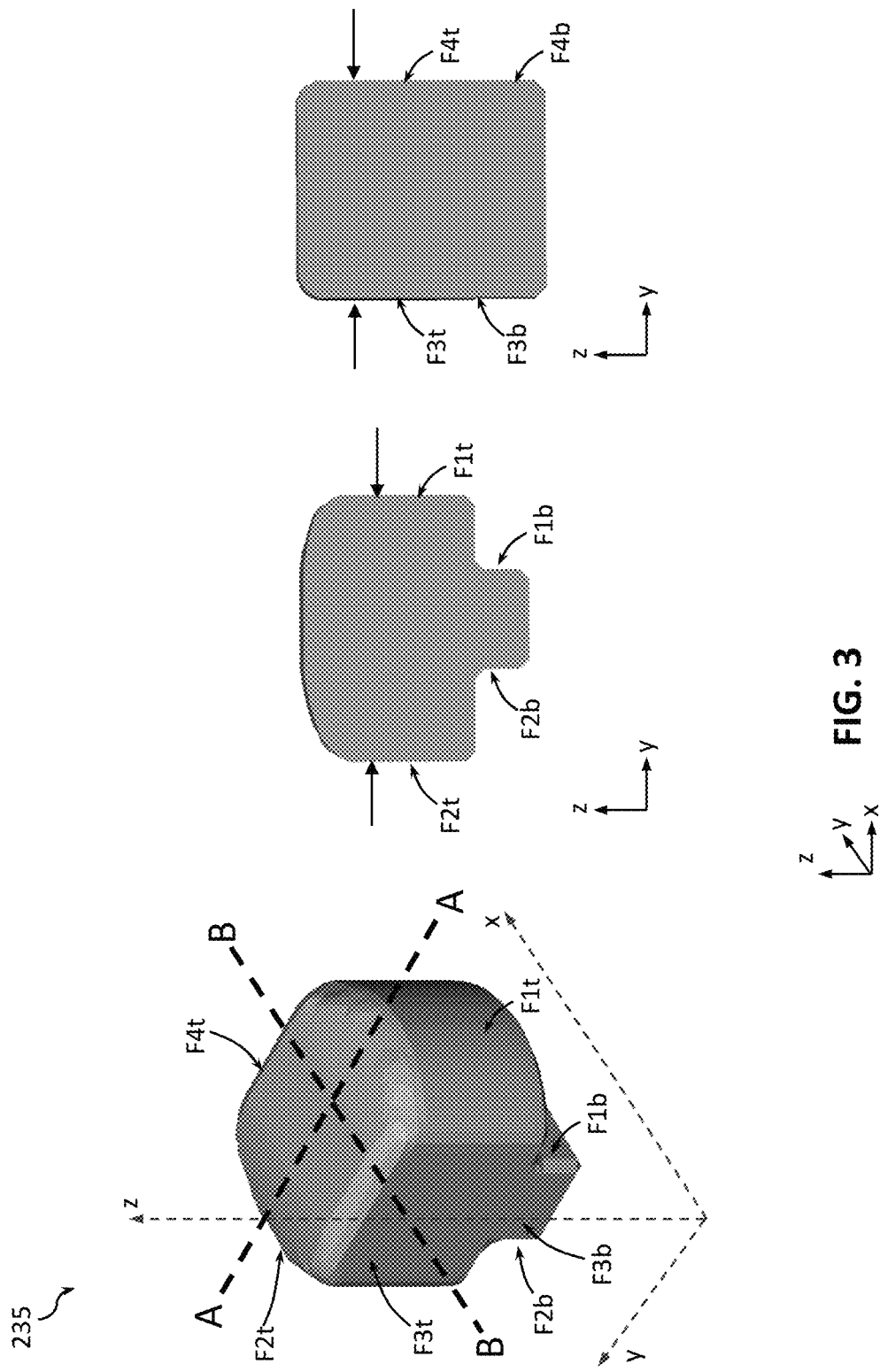
FIG. 3 illustrates various views of a stacked via of an example IC structure manufactured according to the method of FIG. 1, in accordance with some embodiments.

FIG. 3 illustrates an example of the stacked via 235 of FIG. 2P, but further showing details and different views as could be seen in a real-life device. In particular, the left view of FIG. 3 is a perspective drawing with the x-y-z coordinate system that is the same as in FIG. 2P, the middle view of FIG. 3 is a cross-section along the plane AA shown in the left view of FIG. 3 (i.e., a cross-section along a y-z plane, similar to the plane AA shown in FIG. 2D), and the right view of FIG. 3 is a cross-section along the plane BB shown in the left view of FIG. 3 (i.e., a cross-section along an x-z plane). Although, in order to not clutter the drawing, FIG. 3 does not have a reference numeral "219" pointing to the bottom via portion of the stacked via 235, it illustrates first, second, third, and fourth side faces of the bottom via portion 219, labeled in FIG. 3 as, respectively, faces F1$b$, F2B, F3$b$, and F4$b$ (where "b" stands for "bottom"). Similarly, although, in order to not clutter the drawing, FIG. 3 does not have a reference numeral "223" pointing to the top via portion of the stacked via 235, it illustrates first, second, third, and fourth side faces of the top via portion 223, labeled in FIG. 3 as, respectively, faces F1$t$, F2$t$, F3$t$, and F4$t$ (where "t" stands for "top"). In the following descriptions, it is assumed that the first face Fit of a given top via portion 223 is the face that faces the same direction as the first face F1$b$ of the corresponding bottom via portion 219 to which the top via portion 223 is coupled, the second face F2$t$ of a given top via portion 223 is the face that faces the same direction as the second face F2$b$ of the corresponding bottom via portion 219 to which the top via portion 223 is coupled, the third face F3$t$ of a given top via portion 223 is the face that faces the same direction as the third face F3$b$ of the corresponding bottom via portion 219 to which the top via portion 223 is coupled, and the fourth face F4$t$ of a given top via portion 223 is the face that faces the same direction as the fourth face F4$b$ of the corresponding bottom via portion 219 to which the top via portion 223 is coupled, as shown in FIG. 2P.

To assist the description of the characteristic features, FIG. 2P further illustrates labels "S1$b$" and "S2$b$" for, respectively, first and second sidewalls of the bottom metal line 204 to which the bottom via portion 219 of the stacked via 235 is coupled. In addition, FIG. 2P further illustrates labels "S1$t$" and "S2$t$" for, respectively, first and second sidewalls of the top metal line 234-2, but analogous sidewalls may be shown for the top metal line 234-1 to which the top via portion 223 of the stacked via 235 is coupled (sidewalls S1$t$ and S2$t$ are not shown in FIG. 2P for the top metal line 234-1 in order to not clutter the drawing).

One characteristic feature is that, as a result of using selective growth of the M2 material 221 to form the stacked via 235, as described above, the bottom via portion 219 may be self-aligned to the corresponding bottom metal line 204 (i.e., to the bottom metal line 204-3, as shown in FIG. 2P) in a direction of the y-axis of the example coordinate system shown. In this context, self-alignment means that the face F1$b$ may be self-aligned with the sidewall S1$b$, while the face F2$b$ may be self-aligned with the sidewalls S2$b$. In other words, self-alignment may mean that the face F1$b$ may be in a single plane with the sidewall S1$b$, while the face F2$b$ may be in a single plane with the sidewall S2$b$. In some embodiments, these two planes may be substantially parallel to one another, and both perpendicular to the support structure 201, as is shown in the example shown in FIG. 2P (e.g., if the fabrication of the bottom metal line 204 is such that the sidewalls S1$b$ and S2$b$ of the bottom metal line 204 are substantially vertical, i.e., perpendicular to the support structure 201). However, in other embodiments, the plane of the face F1$b$ and the sidewalls S1$b$ may be not parallel to the plane of the face F2$b$ and the sidewalls S2$b$, e.g., if the cross-section of the bottom metal line 204 in an y-z plane is not a rectangle but a trapezoid (e.g., due to particular process used to form the bottom metal line 204). Whether parallel or not, in various embodiments, the opposing faces F1$b$ and F2$b$ of the bottom via portion 219 may be substantially flat (i.e., each belonging to a single plane), which is another characteristic feature of the method 100, resulting from the fact that the bottom via portion 219 is formed in place where the capping material 206 used to be.

Another characteristic feature of the use of the method 100 is that the other two opposing faces of the bottom via portion 219, faces F3*b* and F4*b*, are self-aligned to the corresponding top metal line 234 (i.e., to the top metal line 234-1, as shown in FIG. 2P) in a direction of the x-axis of the example coordinate system shown. In this context, self-alignment means that the face F3*b* may be self-aligned with the sidewall S1*t*, while the face F4*b* may be self-aligned with the sidewalls S2*t*. In other words, self-alignment may mean that the face F3*b* may be in a single plane with the sidewall S1*t*, while the face F4*b* may be in a single plane with the sidewall S2*t*. This feature results from the fact that the opening for the bottom via portion 219 is formed based on etching through the openings between the mask material defining locations of the future top metal lines 234 (see, e.g., the processes 108 and 110 of the method 100). In some embodiments, the plane of the face F3*b* and the sidewall S1*t* and the plane of the face F4*b* and S2*t* may be substantially parallel to one another, and both perpendicular to the support structure 201, as is shown in the example shown in FIG. 3 and FIG. 2P. However, in other embodiments, the plane of the face F3*b* and the sidewalls S1*t* may be not parallel to the plane of the face F4*b* and the sidewalls S2*t*, e.g., if the cross-sections of the bottom via portion 219 and the top metal line 234 in an x-z plane are not rectangles but trapezoids (e.g., due to particular process used to form the bottom via portion 219 and the top metal line 234). Whether parallel or not, in various embodiments, the opposing faces F3*b* and F4*b* of the bottom via portion 219 may be substantially flat (i.e., each belonging to a single plane), which is another characteristic feature of the method 100, resulting from the fact that the bottom via portion 219 is formed based on etching through the openings between the mask material defining locations of the future top metal lines 234.

Similarly, another characteristic feature is that the other two opposing faces of the top via portion 223, faces F3*t* and F4*t*, are also self-aligned to the corresponding top metal line 234 (i.e., to the top metal line 234-1, as shown in FIG. 2P) in a direction of the x-axis of the example coordinate system shown. In this context, self-alignment means that the face F3*t* may be self-aligned with the sidewall S1*t* (and, therefore, also with the face F3*b*), while the face F4*t* may be self-aligned with the sidewalls S2*t* (and, therefore, also with the face F4*b*). In other words, self-alignment may mean that the face F3*t* may be in a single plane with the sidewall S1*t*, while the face F4*t* may be in a single plane with the sidewall S2*t*. This feature results from the fact that the opening for the top via portion 223 is formed based on etching through the openings between the mask material defining locations of the future top metal lines 234 (see, e.g., the processes 108 and 110 of the method 100). In some embodiments, the plane of the face F3*t* and the sidewall S1*t* and the plane of the face F4*t* and S2*t* may be substantially parallel to one another, and both perpendicular to the support structure 201, as is shown in the example shown in FIG. 3 and FIG. 2P. However, in other embodiments, the plane of the face F3*t* and the sidewalls S1*t* may be not parallel to the plane of the face F4*t* and the sidewalls S2*t*, e.g., if the cross-sections of the top via portion 223 and the top metal line 234 in an x-z plane are not rectangles but trapezoids (e.g., due to particular process used to form the bottom via portion 219 and the top metal line 234). Whether parallel or not, in various embodiments, the opposing faces F3*t* and F4*t* of the top via portion 223 may be substantially flat (i.e., each belonging to a single plane), which is another characteristic feature of the method 100, resulting from the fact that the top via portion 223 is formed based on etching through the openings between the mask material defining locations of the future top metal lines 234. On the other hand, the faces F1*t* and F2*t* may not be self-aligned to anything and just be defined by the lithography of the via opening 211 (see, e.g., FIG. 2D). Therefore, the faces F1*t* and F2*t* may be curved, as shown in the example of FIG. 3, not flat.

Other characteristic features of the method 100 are represented by distances between some faces. For example, FIG. 3 further illustrates that, in some embodiments, a distance between the faces F1*b* and F2*b* may be smaller than a distance between the faces F1*t* and F2*t* (both distances measured along the y-axis of the example coordinate system shown). The width of the top via portion 223 measured along the y-axis may be set by the lithography of the via mask used to form the opening 211 (see, e.g., FIG. 2D), while the width of the bottom via portion 219 measured along the y-axis may be set by the width of the bottom metal line 204 to which the bottom via portion 219 is coupled. In another example, FIG. 3 illustrates that, in some embodiments, a distance between the faces F3*t* and F4*t* may be substantially the same as a distance between the faces F3*b* and F4*b* (both distances measured along the x-axis of the example coordinate system shown). The widths of both the top via portion 223 and the bottom via portion 219 measured along the x-axis may be set by the width of the top metal line 234 to which the top via portion 223 (and, therefore, the bottom via portion 219) is coupled.

The IC structures illustrated in and described with reference to FIG. 2 and FIG. 3 do not represent an exhaustive set of arrangements in which one or more stacked vias with bottom portions formed using selective growth as described herein may be integrated, but merely provide examples of such arrangements.

EXAMPLE DEVICES

The IC structures with one or more stacked vias with bottom portions formed using selective growth, disclosed herein, may be included in any suitable electronic device. For example, in various embodiments, the IC structures as described herein may be a part of at least one of a memory device, a computing device, a wearable device, a handheld electronic device, and a wireless communications device. FIGS. 4-7 illustrate various examples of devices that may include one or more stacked vias with bottom portions formed using selective growth disclosed herein.

Figures 4A, 4B:
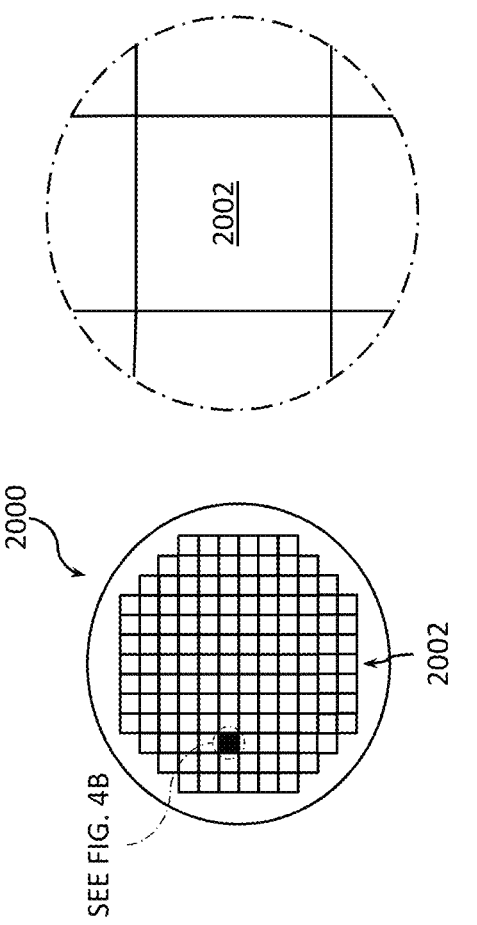
FIGS. 4A and 4B are top views of, respectively, a wafer and dies that may include one or more stacked vias with bottom portions formed using selective growth in accordance with any of the embodiments disclosed herein.

FIGS. 4A-4B are top views of a wafer 2000 and dies 2002 that may include one or more stacked vias with bottom portions formed using selective growth in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 5. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more stacked vias with bottom portions formed using selective growth as described herein). After the fabrication of the semiconductor product is complete (e.g., after manufacture of one or more layers of an IC structure, e.g., a metallization stack, with stacked vias with bottom portions formed using selective growth as described herein), the wafer 2000 may undergo a singulation process in which each of the dies 2002 is separated from one another to provide discrete "chips" of the semiconductor product. In particular, devices that include one or more stacked vias with bottom portions formed using selective growth as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a static RAM (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 7) or other logic that is configured to store information in the memory devices or execute instructions stored in the memory array.

Figure 5:
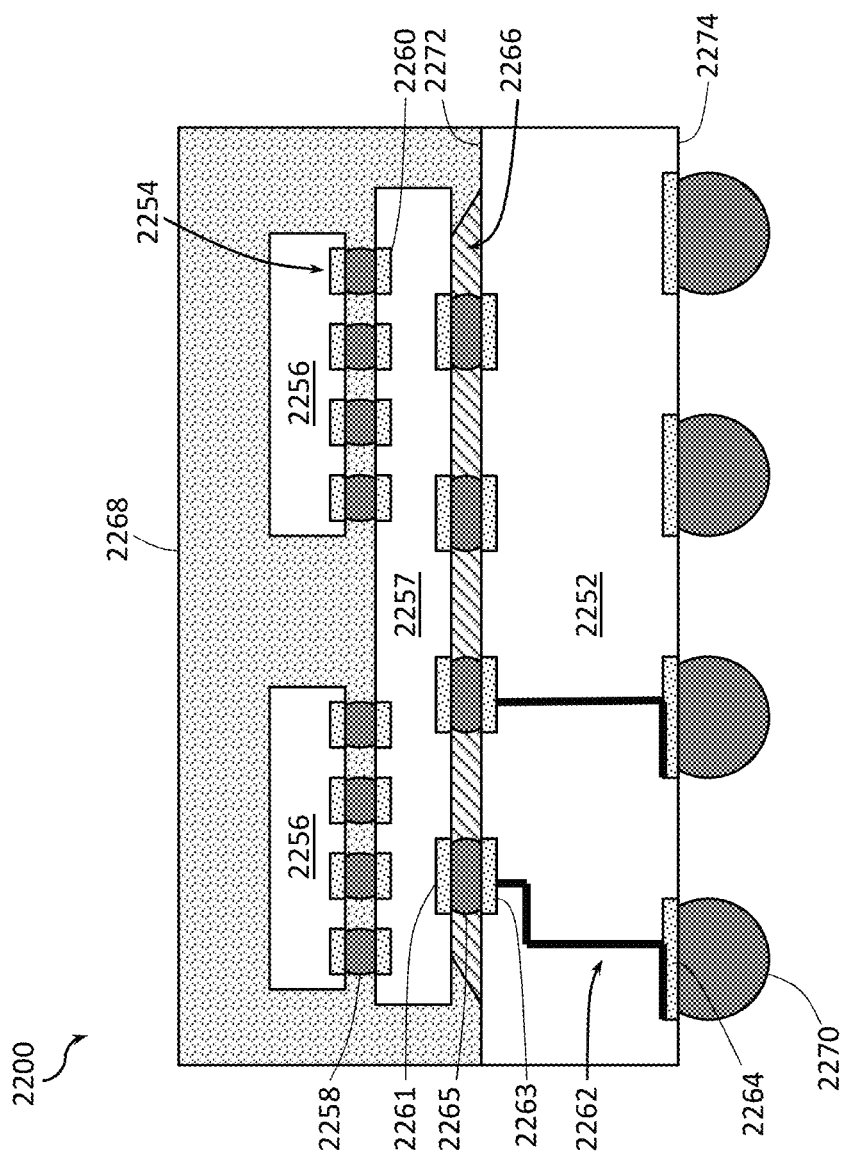
FIG. 5 is a cross-sectional side view of an IC package that may include one or more stacked vias with bottom portions formed using selective growth in accordance with any of the embodiments disclosed herein.

FIG. 5 is a side, cross-sectional view of an example IC package 2200 that may include one or more stacked vias with bottom portions formed using selective growth in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 5 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 5 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 5 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 6.

The dies 2256 may take the form of any of the embodiments of the die 2002 discussed herein (e.g., may include any of the embodiments of the IC structures with one or more stacked vias with bottom portions formed using selective growth as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more IC structures with one or more stacked vias with bottom portions formed using selective growth as discussed above; in some embodiments, at least some of the dies 2256 may not include any stacked vias with bottom portions formed using selective growth.

The IC package 2200 illustrated in FIG. 5 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 5, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 6:
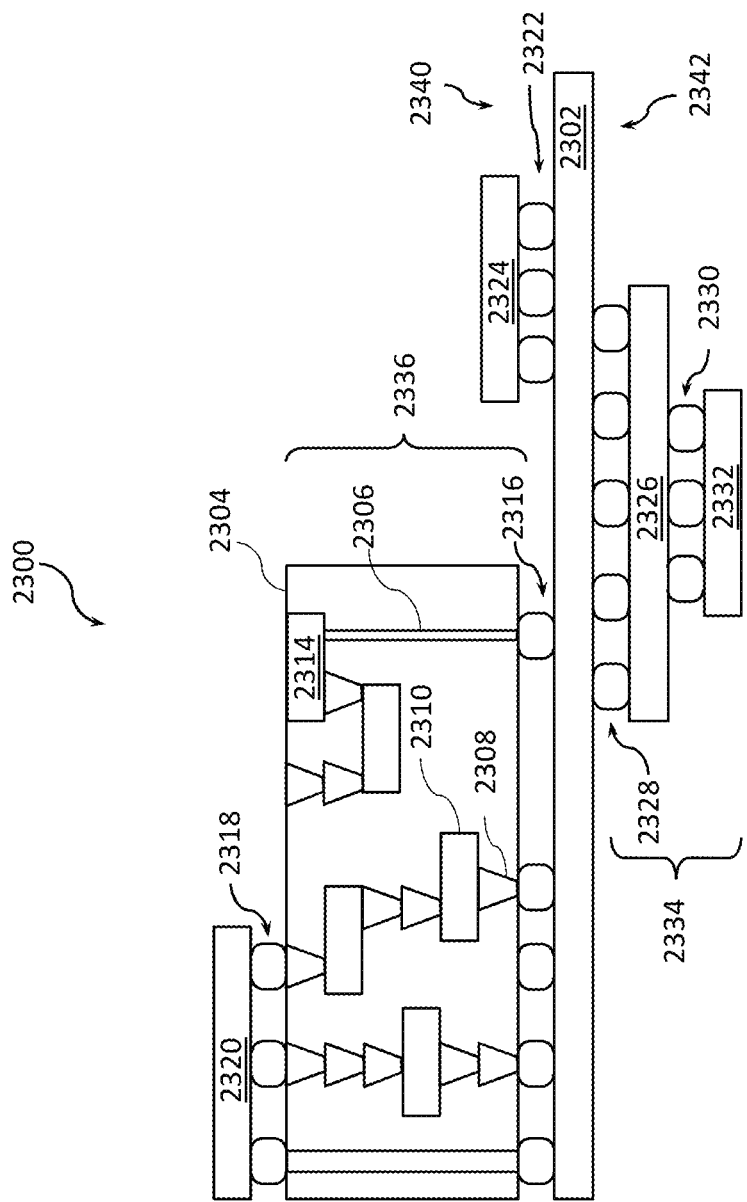
FIG. 6 is a cross-sectional side view of an IC device assembly that may include one or more stacked vias with bottom portions formed using selective growth in accordance with any of the embodiments disclosed herein.

FIG. 6 is a cross-sectional side view of an IC device assembly 2300 that may include components having one or more stacked vias with bottom portions formed using selective growth in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more stacked vias with bottom portions formed using selective growth in accordance with any of the embodiments disclosed herein; e.g., any of the IC packages discussed below with reference to the IC device assembly 2300 may take the form of any of the embodiments of the IC package 2200 discussed above with reference to FIG. 5 (e.g., may include one or more stacked vias with bottom portions formed using selective growth provided on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 6 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 6), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 4B), an IC device, or any other suitable component. In particular, the IC package 2320 may include one or more stacked vias with bottom portions formed using selective growth as described herein. Although a single IC package 2320 is shown in FIG. 6, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 6, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include any number of metal lines 2310, vias 2308, and through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 6 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 7:
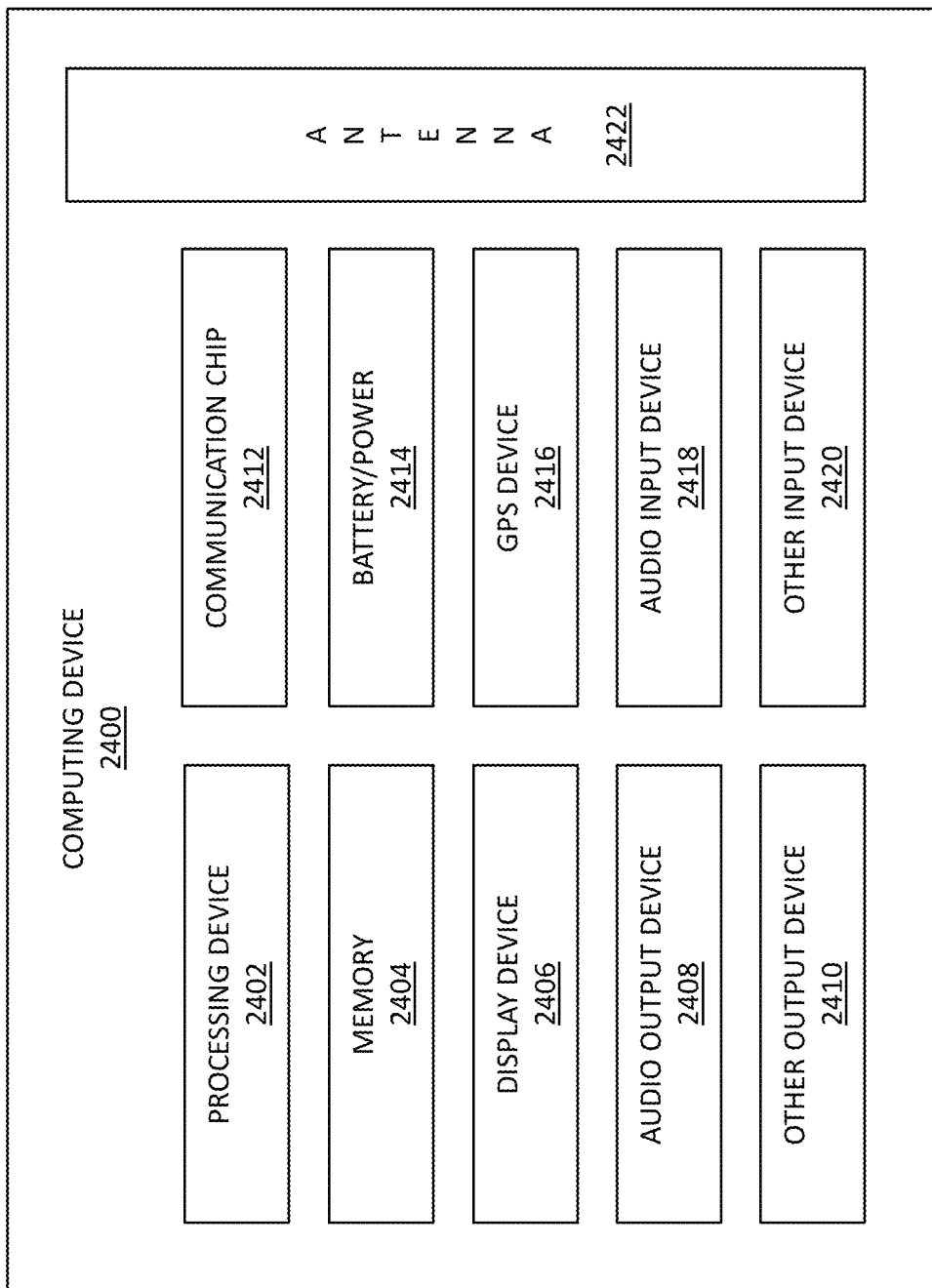
FIG. 7 is a block diagram of an example computing device that may include one or more stacked vias with bottom portions formed using selective growth in accordance with any of the embodiments disclosed herein.

FIG. 7 is a block diagram of an example computing device 2400 that may include one or more components with one or more stacked vias with bottom portions formed using selective growth in accordance with any of the embodiments disclosed herein. For example, any suitable ones of the components of the computing device 2400 may include a die (e.g., the die 2002, shown in FIG. 4B) implementing stacked vias with bottom portions formed using selective growth in accordance with any of the embodiments disclosed herein. Any of the components of the computing device 2400 may include an IC package 2200 (e.g., as shown in FIG. 5). Any of the components of the computing device 2400 may include an IC device assembly 2300 (e.g., as shown in FIG. 6).

A number of components are illustrated in FIG. 7 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system on a chip (SoC) die.

Additionally, in various embodiments, the computing device 2400 may not include one or more of the components illustrated in FIG. 7, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC structure that includes a support structure (e.g., a support structure 201, shown in the present drawings, e.g., a substrate), a first metallization layer that includes a bottom electrically conductive line, and a second metallization layer that includes a top electrically conductive line, where the first metallization layer is between the support structure and the second metallization layer. The IC structure further includes a via having a bottom via portion coupled to the bottom electrically conductive line and a top via portion coupled to the top electrically conductive line. In such an IC structure, a dimension of the bottom via portion along a first axis (e.g., the y-axis) of a plane (e.g., the x-y plane) that is parallel to the support structure is substantially equal to a dimension of the bottom electrically conductive line along the first axis, and a dimension of the bottom via portion along a second axis (e.g., the x-axis) of the plane (e.g., the x-y plane) that is parallel to the support structure, the second axis being different from (e.g., perpendicular to) the first axis, is substantially equal to a dimension of the top electrically conductive line along the second axis.

Example 2 provides the IC structure according to example 1, where a dimension of the top via portion along the second axis is substantially equal to the dimension of the top electrically conductive line along the second axis (and, therefore, substantially equal to the dimension of the bottom via portion along the second axis).

Example 3 provides the IC structure according to any one of the preceding examples, where the bottom via portion is self-aligned to the bottom electrically conductive line in the direction of the first axis because a first face of the bottom via portion (e.g., the face F1$b$, shown in the present drawings) is substantially in single plane with a first sidewall of the bottom electrically conductive line (e.g., the sidewall S1$b$, shown in the present drawings), and a second face of the bottom via portion (e.g., the face F2$b$, shown in the present drawings) is substantially in a single plane with a second sidewall of the bottom electrically conductive line (e.g., the sidewall S2$b$, shown in the present drawings), where the second face of the bottom via portion is opposite the first face of the bottom via portion.

Example 4 provides the IC structure according to any one of the preceding examples, where the top via portion is self-aligned to the top electrically conductive line in the direction of the second axis because a third face of the top via portion (e.g., the face F3$t$, shown in the present drawings) is substantially in a single plane with a first sidewall of the top electrically conductive line (e.g., the sidewall S1$t$, shown in the present drawings), and a fourth face of the top via portion (e.g., the face F4$t$, shown in the present drawings) is substantially in a single plane with a second sidewall of the top electrically conductive line (e.g., the sidewall S2$t$, shown in the present drawings), where the fourth face of the top via portion is opposite the third face of the top via portion.

Example 5 provides the IC structure according to any one of the preceding claims, where the bottom via portion is further self-aligned to the top electrically conductive line in the direction of the second axis because a third face of the bottom via portion (e.g., the face F3$b$, shown in the present drawings) is substantially in a single plane with a first sidewall of the top electrically conductive line (e.g., the sidewall S1$t$, shown in the present drawings), and a fourth face of the bottom via portion (e.g., the face F4$b$, shown in the present drawings) is substantially in a single plane with a second sidewall of the top electrically conductive line (e.g., the sidewall S2$t$, shown in the present drawings), where the fourth face of the bottom via portion is opposite the third face of the bottom via portion.

Example 6 provides the IC structure according to any one of the preceding examples, where each of the bottom via portion and a top via portion has a first face, a second face, a third face, and a fourth face, where the second face is opposite (i.e., does not share an edge with) the first face, and where the fourth face is opposite the third face. For example, assuming that, ideally, the via portions have sidewalls substantially perpendicular to the substrate and referring to the example coordinate system shown in the present drawings, the first face is a face in one x-z plane, the second face is a face in another x-z plane, which is at a certain distance (i.e., a width of the bottom electrically conductive line) from the first x-z plane, the third face is a face in one y-z plane, and the fourth face is a face in another y-z plane, which is at a certain distance (i.e., a width of the top electrically conductive line) from the first y-z plane. In such an IC structure, the first face of the bottom via portion is in a single plane with a first sidewall of the bottom electrically conductive line, the second face of the bottom via portion is in a single plane with a second sidewall of the bottom electrically conductive line, the third face of the top via portion is in a single plane with a first sidewall of the top electrically conductive line, and the fourth face of the top via portion is in a single plane with a second sidewall of the top electrically conductive line.

Example 7 provides the e IC structure according to example 6, where a distance between the first and second faces of the bottom via portion is smaller than a distance between the first and second faces of the top via portion (see, e.g., the cross-sectional side view of the y-z plane shown in FIG. 3).

Example 8 provides the IC structure according to examples 6 or 7, where a distance between the third and fourth faces of the top via portion is substantially the same as (i.e., substantially equal to) a distance between the third and fourth faces of the bottom via portion (see, e.g., the cross-sectional side view of the x-z plane shown in FIG. 3).

Example 9 provides the IC structure according to any one of examples 6-8, where each of the first and second faces of the bottom via portion is substantially flat (i.e., each substantially belongs to a single plane).

Example 10 provides the IC structure according to any one of examples 6-9, where each of the third and fourth faces of the bottom via portion is substantially flat.

In a further claim, each of the third and fourth faces of the top via portion of the IC structure according to any one of claims 6-10 is substantially flat.

Example 11 provides an IC structure that includes a support structure, a first metallization layer and a second metallization layer provided over the support structure, and a via. The first metallization layer includes a bottom electrically conductive line, the second metallization layer includes a top electrically conductive line, and the first metallization layer is between the support structure and the second metallization layer. The via has a bottom via portion coupled to the bottom electrically conductive line and a top via portion coupled to the top electrically conductive line, where the bottom via portion is self-aligned to the bottom electrically conductive line, and the top via portion is self-aligned to the top electrically conductive line.

Example 12 provides the IC structure according to example 11, where the bottom via portion is self-aligned to the bottom electrically conductive line by: having a first face of the bottom via portion (e.g., the face F1$b$, shown in the present drawings) being substantially in a single plane with a first sidewall of the bottom electrically conductive line (e.g., the sidewall S1$b$, shown in the present drawings), and having a second face of the bottom via portion being (e.g., the face F2$b$, shown in the present drawings) substantially in a single plane with a second sidewall of the bottom electrically conductive line (e.g., the sidewall S2$b$, shown in the present drawings), where the second face of the bottom via portion is opposite the first face of the bottom via portion.

Example 13 provides the IC structure according to example 11, where the bottom via portion is self-aligned to the bottom electrically conductive line by: having a first face of the bottom via portion (e.g., the face F1$b$, shown in the present drawings) being aligned with a first sidewall of the bottom electrically conductive line (e.g., the sidewall S1$b$, shown in the present drawings), and having a second face of the bottom via portion (e.g., the face F2$b$, shown in the present drawings) being aligned with a second sidewall of the bottom electrically conductive line (e.g., the sidewall S2$b$, shown in the present drawings), where the second face of the bottom via portion is opposite the first face of the bottom via portion.

Example 14 provides the IC structure according to any one of examples 11-13, where the top via portion is self-aligned to the top electrically conductive line by having a third face of the top via portion (e.g., the face F3$t$, shown in the present drawings) being substantially in a single plane with a first sidewall of the top electrically conductive line (e.g., the sidewall S1$t$, shown in the present drawings), and having a fourth face of the top via portion (e.g., the face F4$t$, shown in the present drawings) being substantially in a single plane with a second sidewall of the top electrically conductive line (e.g., the sidewall S2$t$, shown in the present drawings), where the fourth face of the top via portion is opposite the third face of the top via portion.

Example 15 provides the IC structure according to any one of examples 11-13, where the top via portion is self-aligned to the top electrically conductive line by having a third face of the top via portion (e.g., the face F3$t$, shown in the present drawings) being aligned with a first sidewall of the top electrically conductive line (e.g., the sidewall S1$t$, shown in the present drawings), and having a fourth face of the top via portion (e.g., the face F4$t$, shown in the present drawings) being aligned with a second sidewall of the top electrically conductive line (e.g., the sidewall S2$t$, shown in the present drawings), where the fourth face of the top via portion is opposite the third face of the top via portion.

Example 16 provides the IC structure according to any one of examples 11-15, where each of the bottom via portion and a top via portion has a first face, a second face, a third face, and a fourth face, where the second face is opposite (i.e., does not share an edge with) the first face, and where the fourth face is opposite the third face. In such an IC structure, the first face of the bottom via portion is in a single plane with a first sidewall of the bottom electrically conductive line, the second face of the bottom via portion is in a single plane with a second sidewall of the bottom electrically conductive line, the third face of the top via portion is in a single plane with a first sidewall of the top electrically conductive line, and the fourth face of the top via portion being in a single plane with a second sidewall of the top electrically conductive line.

Example 17 provides the IC structure according to example 16, where a distance between the first and second faces of the bottom via portion is smaller than a distance between the first and second faces of the top via portion (see, e.g., the cross-sectional side view of the y-z plane shown in FIG. 3).

Example 18 provides the IC structure according to examples 16 or 17, where a distance between the third and fourth faces of the top via portion is substantially the same as a distance between the third and fourth faces of the bottom via portion (see, e.g., the cross-sectional side view of the x-z plane shown in FIG. 3).

Example 19 provides the IC structure according to any one of examples 16-17, where each of the first and second faces of the bottom via portion is substantially flat (i.e., each substantially belongs to a single plane).

Example 20 provides the IC structure according to any one of examples 16-19, where each of the third and fourth faces of the top via portion is substantially flat.

Example 21 provides the IC structure according to any one of examples 16-20, where each of the third and fourth faces of the bottom via portion is substantially flat.

Example 22 provides the IC structure according to any one of the preceding examples, where the first metallization layer includes a plurality of bottom electrically conductive lines, the bottom electrically conductive line is a first bottom electrically conductive line of the plurality of bottom electrically conductive lines, and at least a portion of a top of a second bottom electrically conductive line, different from the first bottom electrically conductive line, is capped with a capping material.

Example 23 provides the IC structure according to example 22, where a portion of a top of the first bottom electrically conductive line that is not coupled to the bottom via portion is capped with the capping material.

Example 24 provides the IC structure according to example 23, where a portion of the bottom via portion is in contact with the capping material.

Example 25 provides the IC structure according to any one of examples 23-24, where the capping material is sufficiently etch-selective with respect to a dielectric material enclosing sidewalls of the bottom electrically conductive line (e.g., sidewalls of each of the plurality of bottom electrically conductive lines).

Example 26 provides an IC structure that includes a support structure, a first metallization layer and a second metallization layer provided over the support structure, and a via. The first metallization layer includes a bottom electrically conductive line, the second metallization layer includes a top electrically conductive line, and the first metallization layer is between the support structure and the second metallization layer. The via has a bottom via portion coupled to the bottom electrically conductive line and a top via portion coupled to the top electrically conductive line, where a portion of a top of the bottom electrically conductive line that is not coupled to the bottom via portion is capped with a capping material, and the capping material is etch-selective with respect to a dielectric material at least partially enclosing sidewalls of the bottom electrically conductive line.

Example 27 provides the IC structure according to example 26, where the first metallization layer includes a plurality of bottom electrically conductive lines, the bottom electrically conductive line is a first bottom electrically conductive line of the plurality of bottom electrically conductive lines, and at least a portion of a top of a second bottom electrically conductive line, different from the first bottom electrically conductive line is capped with the capping material.

Example 28 provides the IC structure according to examples 26 or 27, where the IC structure further includes one or more features according to any one of examples 1-25.

Example 29 provides the IC structure according to any one of the preceding examples, where each of the electrically conductive line and the top electrically conductive line has a length, a width, and a height, the length being greater than each of the width and the height, the length of the bottom electrically conductive line is a dimension measured along an x-axis of a coordinate system, the length of the top electrically conductive line is a dimension measured along a y-axis of the coordinate system, and the height of each of the bottom electrically conductive line and the top electrically conductive line is a dimension measured along a z-axis of the coordinate system.

Example 30 provides a method of fabricating an IC structure. The method includes providing a first metallization layer and a second metallization layer over a support structure, where the first metallization layer includes a bottom electrically conductive line, the second metallization layer includes a top electrically conductive line, and the first metallization layer is between the support structure and the second metallization layer. The method further includes providing a via having a bottom via portion coupled to the bottom electrically conductive line and a top via portion coupled to the top electrically conductive line, where a portion of a top of the bottom electrically conductive line that is not coupled to the bottom via portion is capped with a capping material, and the capping material is etch-selective with respect to a dielectric material at least partially enclosing sidewalls of the bottom electrically conductive line.

Example 31 provides the method according to example 30, where the first metallization layer includes a plurality of bottom electrically conductive lines, the bottom electrically conductive line is a first bottom electrically conductive line of the plurality of bottom electrically conductive lines, and at least a portion of a top of a second bottom electrically conductive line, different from the first bottom electrically conductive line is capped with the capping material.

Example 32 provides the method according to any one of examples 30-31, where the method further includes processes for forming the IC structure as the IC structure according to any one of examples 1-29.

Example 33 provides an IC package that includes an IC die that includes an IC structure according to any one of the preceding examples (e.g., the IC structure according to any one of examples 1-29 and/or an IC structure formed according to the method according to any one of examples 30-32) and a further IC component, coupled to the IC die.

Example 34 provides the IC package according to example 33, where the further component is one of a package substrate, a flexible substrate, or an interposer.

Example 35 provides the IC package according to examples 33 or 34, where the further component is coupled to the IC die via one or more first-level interconnects.

Example 36 provides the IC package according to example 35, where the one or more first-level interconnects include one or more solder bumps, solder posts, or bond wires.

Example 37 provides an electronic device that includes a circuit board; and an IC die coupled to the circuit board, where the IC die includes one or more of: 1) one or more of the IC structures according to any one of claims 1-29, 2) one or more of the IC structures formed according to the method according to any one of claims 30-32, and 3) one or more of IC packages according to any one of the preceding examples (e.g., each IC package may be an IC package according to any one of examples 33-36).

Example 38 provides the electronic device according to example 37, where the electronic device is a wearable electronic device (e.g., a smart watch) or handheld electronic device (e.g., a mobile phone).

Example 39 provides the electronic device according to examples 37 or 38, where the electronic device is a server processor.

Example 40 provides the electronic device according to examples 37 or 38, where the electronic device is a motherboard.

Example 41 provides the electronic device according to any one of examples 37-40, where the electronic device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a first metallization layer and a second metallization layer, wherein the first metallization layer includes a first electrically conductive line, the second metallization layer includes a second electrically conductive line, and the second metallization layer is over the first metallization layer; and
a via having a first via portion coupled to the first electrically conductive line and a second via portion coupled to the second electrically conductive line, wherein:
a dimension of the first via portion along a first axis of a plane that is parallel to the first metallization layer is substantially equal to a dimension of the first electrically conductive line along the first axis,
a dimension of the first via portion along a second axis of the plane that is parallel to the first metallization layer, the second axis being different from the first axis, is substantially equal to a dimension of the second electrically conductive line along the second axis,
a first face of the first via portion is substantially in a single plane with a first sidewall of the first electrically conductive line, and
a second face of the first via portion is substantially in a single plane with a second sidewall of the first electrically conductive line, wherein the second face of the first via portion is opposite the first face of the first via portion.

2. The IC structure according to claim 1, wherein a dimension of the second via portion along the second axis is substantially equal to the dimension of the second electrically conductive line along the second axis.

3. The IC structure according to claim 1, wherein:
a first face of the second via portion is substantially in a single plane with a first sidewall of the second electrically conductive line, and
a second face of the second via portion-is substantially in a single plane with a second sidewall of the second electrically conductive line, wherein the second face of the second via portion is opposite the first face of the second via portion.

4. The IC structure according to claim 1, wherein:
a third face of the first via portion is substantially in a single plane with a first sidewall of the second electrically conductive line, and
a fourth face of the first via portion is substantially in a single plane with a second sidewall of the second electrically conductive line, wherein the fourth face of the first via portion is opposite the third face of the first via portion.

5. The IC structure according to claim 1, wherein a distance between the first and second faces of the first via portion is smaller than a distance between two opposite faces of the second via portion.

6. The IC structure according to claim 1, wherein the first face of the first via portion and the second face of the first via portion are substantially flat.

7. The IC structure according to claim 1, wherein:
the first metallization layer includes a plurality of first electrically conductive lines,
the first electrically conductive line is one of the plurality of first electrically conductive lines, and
at least a portion of a top of another one of the plurality of first electrically conductive lines, different from the first electrically conductive line, has a capping material thereon.

8. An electronic device, comprising:
a circuit board;
an integrated circuit (IC) die, coupled to the circuit board;
a first metallization layer and a second metallization layer over the IC die, wherein the first metallization layer includes a bottom electrically conductive line, the second metallization layer includes a top electrically conductive line, and the first metallization layer is between the IC die and the second metallization layer; and
a via having a bottom via portion coupled to the bottom electrically conductive line and a top via portion coupled to the top electrically conductive line,
wherein:
the bottom via portion is self-aligned to the bottom electrically conductive line and the top via portion is self-aligned to the top electrically conductive line,
the first metallization layer includes a plurality of bottom electrically conductive lines,
the bottom electrically conductive line is a first bottom electrically conductive line of the plurality of bottom electrically conductive lines, and
at least a portion of a top of a second bottom electrically conductive line, different from the first bottom electrically conductive line, has a capping material thereon.

9. The electronic device according to claim 8, wherein a portion of a top of the first bottom electrically conductive line that is not coupled to the bottom via portion has the capping material thereon.

10. The electronic device according to claim 9, wherein a portion of the bottom via portion is in contact with the capping material.

11. The electronic device according to claim 9, wherein the capping material is etch-selective with respect to a dielectric material enclosing sidewalls of the bottom electrically conductive line.

12. The electronic device according to claim 8, further including one or more communication chips and an antenna.

13. The electronic device according to claim 8, wherein the electronic device is a wearable electronic device or a handheld electronic device.

14. The electronic device according to claim 8, wherein the electronic device is a motherboard.

15. An integrated circuit (IC) structure, comprising:
a first metallization layer and a second metallization layer, wherein the first metallization layer includes a first electrically conductive line, the second metallization layer includes a second electrically conductive line, and the second metallization layer is over the first metallization layer; and
a via having a first via portion coupled to the first electrically conductive line and a second via portion coupled to the second electrically conductive line,
wherein:
a dimension of the first via portion along a first axis of a plane that is parallel to the first metallization layer is substantially equal to a dimension of the first electrically conductive line along the first axis,
a dimension of the first via portion along a second axis of the plane that is parallel to the first metallization layer, the second axis being different from the first axis, is substantially equal to a dimension of the second electrically conductive line along the second axis,
a first face of the second via portion is substantially in a single plane with a first sidewall of the second electrically conductive line, and
a second face of the second via portion is substantially in a single plane with a second sidewall of the second electrically conductive line, wherein the second face of the second via portion is opposite the first face of the second via portion.

16. The IC structure according to claim 15, wherein:
the first metallization layer includes a plurality of first electrically conductive lines,
the first electrically conductive line is one of the plurality of first electrically conductive lines, and
at least a portion of a top of another one of the plurality of first electrically conductive lines, different from the first electrically conductive line, has a capping material thereon.

17. The IC structure according to claim 15, wherein:
a first face of the first via portion is substantially in a single plane with a first sidewall of the first electrically conductive line, and
a second face of the first via portion is substantially in a single plane with a second sidewall of the first electrically conductive line, wherein the second face of the first via portion is opposite the first face of the first via portion.

18. An integrated circuit (IC) structure, comprising:
a first metallization layer and a second metallization layer, wherein the first metallization layer includes a first electrically conductive line, the second metallization layer includes a second electrically conductive line, and the second metallization layer is over the first metallization layer; and
a via having a first via portion coupled to the first electrically conductive line and a second via portion coupled to the second electrically conductive line, wherein:
   a dimension of the first via portion along a first axis of a plane that is parallel to the first metallization layer is substantially equal to a dimension of the first electrically conductive line along the first axis,
   a dimension of the first via portion along a second axis of the plane that is parallel to the first metallization layer, the second axis being different from the first axis, is substantially equal to a dimension of the second electrically conductive line along the second axis,
   a first face of the first via portion is substantially in a single plane with a first sidewall of the second electrically conductive line, and
   a second face of the first via portion is substantially in a single plane with a second sidewall of the second electrically conductive line, wherein the second face of the first via portion is opposite the first face of the first via portion.

19. The IC structure according to claim 18, wherein:
the first metallization layer includes a plurality of first electrically conductive lines,
the first electrically conductive line is one of the plurality of first electrically conductive lines, and
at least a portion of a top of another one of the plurality of first electrically conductive lines, different from the first electrically conductive line, has a capping material thereon.

20. The IC structure according to claim 16, wherein:
a third face of the first via portion is substantially in a single plane with a first sidewall of the first electrically conductive line, and
a fourth face of the first via portion is substantially in a single plane with a second sidewall of the first electrically conductive line, wherein the fourth face of the first via portion is opposite the third face of the first via portion.

* * * * *

UNITED STATES PATENT AND TRADEMARK OFFICE
CERTIFICATE OF CORRECTION

Page 1 of 1

PATENT NO. : 12,211,786 B2
APPLICATION NO. : 17/197659
DATED : January 28, 2025
INVENTOR(S) : Andy Chih-Hung Wei et al.

It is certified that error appears in the above-identified patent and that said Letters Patent is hereby corrected as shown below:

On the Title Page

Item (57), under "ABSTRACT", in Column 2, Line 5, delete "layers," and insert -- layer, --, therefor.

On Page 2, item (56), under "Other Publications", in Column 2, Line 15, delete "teh" and insert -- the --, therefor.

In the Claims

In Column 31, Claim 3, Line 9, delete "portion-is" and insert -- portion is --, therefor.

Signed and Sealed this
Fourth Day of March, 2025

Coke Morgan Stewart
*Acting Director of the United States Patent and Trademark Office*